United States Patent
Witte et al.

(10) Patent No.: US 11,042,096 B2
(45) Date of Patent: Jun. 22, 2021

(54) ALIGNMENT MEASUREMENT SYSTEM

(71) Applicant: ASML Netherlands B.V., Veldhoven (NL)

(72) Inventors: Stefan Michiel Witte, Hoofddorp (NL); Alessandro Antoncecchi, Amsterdam (NL); Hao Zhang, Amsterdam (NL); Stephen Edward, Amsterdam (NL); Paulus Clemens Maria Planken, Jaarsveld (NL); Sebastianus Adrianus Goorden, Eindhoven (NL); Simon Reinald Huisman, Eindhoven (NL); Irwan Dani Setija, Utrecht (NL); David Ferdinand Vles, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/619,803

(22) PCT Filed: May 15, 2018

(86) PCT No.: PCT/EP2018/062557
§ 371 (c)(1),
(2) Date: Dec. 5, 2019

(87) PCT Pub. No.: WO2018/224251
PCT Pub. Date: Dec. 13, 2018

(65) Prior Publication Data
US 2020/0142319 A1 May 7, 2020

(30) Foreign Application Priority Data
Jun. 7, 2017 (EP) .................................... 17174655

(51) Int. Cl.
G03B 27/54 (2006.01)
G03F 7/20 (2006.01)
G03F 9/00 (2006.01)

(52) U.S. Cl.
CPC ........ G03F 7/70133 (2013.01); G03F 9/7053 (2013.01)

(58) Field of Classification Search
CPC .. G03F 7/70133; G03F 9/7053; G03F 9/7084; G01N 21/9501; G01N 21/636; H01L 22/12
See application file for complete search history.

(56) References Cited

U.S. PATENT DOCUMENTS 4,710,030 A 12/1987 Tauc et al.
5,982,482 A 11/1999 Nelson et al.
(Continued)

FOREIGN PATENT DOCUMENTS

EP 1150173 A2 10/2001
JP 2009-038339 A 2/2009
(Continued)

OTHER PUBLICATIONS

International Search Report and Written Opinion of the International Searching Authority directed to related International Patent Application No. PCT/EP2018/062557, dated Aug. 2, 2018; 11 pages.
(Continued)

*Primary Examiner* — Peter B Kim
(74) *Attorney, Agent, or Firm* — Sterne, Kessler, Goldstein & Fox P.L.L.C.

(57) ABSTRACT

A method for determining a characteristic of a feature in an object, the feature being disposed below a surface of the object is disclosed. The surface of the object is irradiated with a pulsed pump radiation beam so as to produce an
(Continued)

acoustic wave in the object. The surface of the object is then irradiated with a measurement radiation beam. A portion of the measurement radiation beam scattered from the surface is received and a characteristic of the feature in the object is determined from at least a portion of the measurement radiation beam scattered from the surface within a measurement time period. A temporal intensity distribution of the pulsed pump radiation beam is selected such that in the measurement time period a signal to background ratio is greater than a signal to background ratio achieved using a single pulse of the pulsed pump radiation beam. The signal to background ratio is a ratio of: (a) signals generated at the surface by reflections of acoustic waves from the feature to (b) background signals generated at the surface by reflections of acoustic waves which have not reflected from the feature.

21 Claims, 9 Drawing Sheets

(56) References Cited

U.S. PATENT DOCUMENTS

| | | | |
|---|---|---|---|
| 6,704,089 | B2 | 3/2004 | Van Der Schaar et al. |
| 6,961,116 | B2 | 11/2005 | Den Boef et al. |
| 8,189,195 | B2 | 5/2012 | Den Boef et al. |
| 9,841,272 | B2 | 12/2017 | Takayanagi et al. |
| 2002/0006560 | A1 | 1/2002 | van der Schaar et al. |
| 2004/0033426 | A1 | 2/2004 | Den Boef et al. |
| 2004/0169859 | A1 | 9/2004 | Smith |
| 2006/0027021 | A1 | 2/2006 | Choi et al. |
| 2009/0195768 | A1 | 8/2009 | Bijnen et al. |
| 2010/0188658 | A1* | 7/2010 | Grossman .......... G01N 21/1717 356/237.5 |
| 2012/0212749 | A1 | 8/2012 | Den Boef et al. |
| 2015/0109624 | A1 | 4/2015 | Kreuzer et al. |
| 2015/0227061 | A1 | 8/2015 | Tinnemans et al. |

FOREIGN PATENT DOCUMENTS

| | | |
|---|---|---|
| JP | 2013-228330 A | 11/2013 |
| JP | 2014-081285 A | 5/2014 |
| JP | 2016-057138 A | 4/2016 |
| NL | 2020921 A | 12/2018 |
| WO | WO 0184129 A2 | 11/2001 |
| WO | WO 2018224251 A1 | 12/2018 |

OTHER PUBLICATIONS

International Preliminary Report on Patentability and Written Opinion of the International Searching Authority directed to related International Patent Application No. PCT/EP2018/062557, dated Dec. 10, 2019; 8 pages.

Grunsteidle, C.M., et al. "Application of SLM generated patterns for laser-ultrasound", IEEE International Ultrasonics Symposium Proceedings, 2014; 4 pages.

Ruello, Pascal and Gusev, Vitalyi E., "Physical mechanisms of coherent acoustic phonons generation by ultrafast laser action", Ultrasonics, vol. 56, Feb. 2015; pp. 21-35.

Huijbregtse et al., "Overlay Performance with Advanced Athena™ Alignment Strategies," Metrology, Inspection, and Process Control for Microlithography XVII, vol. 5038, Jun. 2, 2003; 12 pages.

Japanese Notice of Reasons for Refusal directed to related Japanese Patent Application No. 2019-562337, dated Oct. 27, 2020; 8 pages.

* cited by examiner

ALIGNMENT MEASUREMENT SYSTEM

CROSS-REFERENCE TO RELATED APPLICATIONS

This application claims priority of EP application 17174655.5, which was filed on 7 Jun. 2017 and which is incorporated herein in its entirety by reference.

FIELD

The present invention relates to methods and apparatus for determining a characteristic of a feature in an object, the feature being disposed below a surface of the object. In particular, but not exclusively, it may relate to the determination of the position of an alignment mark using an alignment measurement system. The invention may, for example, form part of an alignment system, or other position measurement system, within a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging the pattern onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment measurement systems by which positions of alignment marks on a substrate can be measured accurately. These alignment measurement systems are effectively position measuring apparatuses. Various different types of alignment marks and different types of alignment measurement systems are known. Generally, an alignment measurement system measures the position of an alignment mark by irradiating it with a measurement radiation beam, receiving at least a portion of the measurement radiation beam scattered from the alignment mark and determining a position of the alignment mark from this scattered radiation.

There is continually a need to provide more accurate position measurements, especially to control overlay errors as product features get smaller and smaller.

As an integrated circuit in most cases is fabricated on a silicon wafer, the alignment marks can be buried by various layers of the integrated circuit. The thicknesses and optical properties of these layers can vary according to the type of integrated circuit. One or many of these layers can be opaque and, as a result, a measurement radiation beam may not be able to penetrate through the layers and reach the alignment mark. This represents a big obstacle for state of the art optical alignment methods.

It is an object of the present invention to provide alternative methods and apparatus that are suitable for determining a characteristic of a feature in an object (for example the position of an alignment mark), the feature being disposed below a surface of the object, which at least partially address one or more problems associated with prior art arrangements, whether identified here or not.

SUMMARY

According to a first aspect of the invention, there is provided a method for determining a characteristic of a feature in an object, the feature being disposed below a surface of the object, the method comprising: irradiating the surface of the object with a pulsed pump radiation beam so as to produce an acoustic wave in the object; irradiating the surface of the object with a measurement radiation beam; receiving at least a portion of the measurement radiation beam scattered from the surface; and determining a characteristic of the feature in the object from at least a portion of the measurement radiation beam scattered from the surface within a measurement time period; wherein a temporal intensity distribution of the pulsed pump radiation beam is selected such that in the measurement time period a signal to background ratio is greater than a signal to background ratio achieved using a single pulse of the pulsed pump radiation beam, the signal to background ratio being a ratio of: (a) signals generated at the surface by reflections of acoustic waves from the feature to (b) background signals generated at the surface by reflections of acoustic waves which have not reflected from the feature.

The first aspect of the present invention relates to methods of indirectly probing or measuring a feature disposed below the surface of the object which involve a selection, choice and/or optimization of the temporal intensity distribution of the pulsed pump radiation beam so as to improve the measurement of the feature during the measurement time period.

It will be appreciated that a pulsed radiation beam comprises a plurality of pulses of radiation (which may be temporally resolved or overlapping). It will be further appreciated that the temporal intensity distribution of a pulsed radiation beam is dependent on: (a) the shape of each pulse; and (b) the time between each pair of pulses. The shape of a pulse may characterized by one or more parameters. For example, each pulse may be generally Gaussian shaped and the shape of such a pulse may be characterized by a width parameter and a height parameter. It will be further appreciated that different pulses may have different shapes. It will be further appreciated that the time between one pair of pulses may differ from the time between another pair of pulses.

As used herein, the term "reflections of acoustic waves" is intended to cover any scattering process which results in a change in direction of the acoustic waves. In particular, it may include specular reflection and diffraction.

In general, every interface between two layers of material with different acoustic properties will produce an acoustic reflection. That is, a portion of an acoustic wave incident on any such interface will be reflected (and another portion will be transmitted). The amplitude of the reflected portion and phase shift of the reflected portion (relative the incident wave) depends on the material properties of the respective layers. The signal formed at the surface of the object is a superposition of many such reflections, which may interfere constructively or destructively depending on their relative phases.

It will be appreciated that the temporal intensity distribution of the pulsed pump radiation beam which achieves an increase in the signal to background ratio in the measurement time period relative to the signal to background ratio achieved using a single pulse of the pulsed pump radiation beam will, in general, be specific to the structure of the object. For example, it may be dependent in the number of layers of material from which the object is formed and the thicknesses and acoustic properties of the layers of material.

For a given object, with a given structure, it may be determined whether or not a particular temporal intensity distribution achieves the desired increase in signal to background ratio by performing the following method.

First, the surface of the object is irradiated with a single pulse of the pump radiation beam so as to produce an acoustic wave in the object and subsequently, during the measurement time period, the strength or contrast of a signal generated at the surface is determined. For example, in some embodiments the feature may be a reflective diffraction grating with a particular pitch, which may result in a surface acoustic wave or modulation on the surface that has substantially the same pitch as the grating. For such embodiments, the strength or contrast of the signal generated at the surface may be related to an amplitude of the surface acoustic wave or modulation.

Second, the surface of the object is irradiated with the temporal intensity distribution to be tested so as to produce an acoustic wave in the object and subsequently, during the measurement time period, the strength or contrast of a signal generated at the surface is determined.

Third, the strength or contrast of the signal obtained using the temporal intensity distribution to be tested is compared to that of the signal obtained using the single pulse of the pump radiation beam. If the strength or contrast of the signal obtained using the temporal intensity distribution to be tested is greater than that of the signal obtained using the single pulse of the pump radiation beam then the temporal intensity distribution achieved the desired increase in signal to background ratio for the first aspect of the invention.

The measurement time period may correspond to a time period during which a portion of an acoustic wave generated by an initial pulse of the pulsed pump radiation beam which is reflected from the feature and not from any other interfaces within the object arrives at the surface.

From an initial pulse of the pulsed pump radiation beam an acoustic wave is generated that may propagate away from the surface. A portion of this acoustic wave may propagate straight to the feature, reflect from the feature and propagate straight back to the surface. This may be referred to as a primary signal generated by the initial pulse. The measurement time period may correspond to the time at which this primary signal arrives at the surface. Therefore, an extent of the measurement time may correspond to a temporal extent of an acoustic pulse generated by the initial pulse and/or may take into account any temporal broadening of the primary signal caused by the propagation of the acoustic wave through the object. In addition, a time delay between the arrival of the initial pulse of the pulsed pump radiation beam at the surface and the arrival of the primary signal may correspond to the time of flight of an acoustic wave from the surface to the feature and back to the surface. This is related to the speed of sound in the, or each, layer of material in the object and the thickness of the or each layer of material in the object.

It will be appreciated that as used herein an initial pulse is intended to mean a pulse which initiates a primary signal. It may or may not be the first pulse incident on the surface. In some embodiments, the method may involve determining the characteristic of the feature in the object from at least a portion of the measurement radiation beam scattered from the surface within a plurality of measurement time periods. Each measurement time period may correspond to the arrival time of a primary signal from a different initial pulse of the pulsed pump radiation beam.

The temporal intensity distribution of the pulsed pump radiation beam may be such that in the measurement time period there is at least partial constructive interference between: (i) a reflected portion of the acoustic wave generated by a first pulse, the reflected portion of the acoustic wave generated by the first pulse having reflected from the feature; and (ii) a reflected portion of the acoustic wave generated by a second pulse, the reflected portion of the acoustic wave generated by the second pulse having also been reflected from the feature.

Such an arrangement generally enhances signals generated by reflections of the acoustic waves from the feature. This is advantageous because it can allow a measurable signal to be achieved with a reduced intensity of the pulsed pump radiation beam. Advantageously, this can reduce the risk of the object being damaged by the individual pulses (for example it can be ensured that each pulse has an energy below a damage threshold of the object).

It will be appreciated that the reflected portion of the acoustic wave generated by a given pulse that has been reflected from the feature and which generates a signal at the surface may in addition have been reflected by one or more interfaces between two layers of material, before and/or after having been reflected by the feature. In general, the reflected portion of the acoustic waves generated by the first and second pulses, which at least partially constructively interfere, travel different path lengths away from and back to the surface.

It will be appreciated that, in order for two reflected portions to constructively interfere at the surface, there should be at least some temporal overlap between the arrival of the two reflected portions at the surface and the two signals should be substantially in phase.

The temporal intensity distribution of the pulsed pump radiation beam may be such that in the measurement time period there is at least partial destructive interference between: (i) a reflected portion of the acoustic wave generated by a first pulse which is not incident on the feature; and (ii) a reflected portion of the acoustic wave generated by a second pulse which is not incident on the feature.

Such an arrangement generally suppresses background signals (which have not reflected from the feature). Such background signals may be generated from reflections between the interfaces between different layers of material within the object. These background signals can reduce the contrast of a signal formed on the surface of the object.

It will be appreciated that the reflected portion of the acoustic wave generated by a given pulse which is not incident on the feature has been reflected by one or more interfaces between two layers of material. In general, the reflected portion of the acoustic waves generated by the first and second pulses which at least partially destructively interfere travel different path lengths away from and back to the surface.

It will be appreciated that, in order for two reflected portions to destructively interfere at the surface, there should be at least some temporal overlap between the arrival of the two reflected portions at the surface and the two signals should be substantially out of phase.

The temporal intensity distribution of the pulsed pump radiation beam may be selected such that the signal to background ratio in the measurement time period is generally maximized.

It will be appreciated that the maximization of the signal to background ratio may involve the selection of one or more parameters of the temporal intensity distribution of the pulsed pump radiation beam that corresponds to, or is proximate to, a local maximum (in this parameter space) of the signal to background ratio.

According to a second aspect of the invention there is provided an apparatus for determining a characteristic of a feature in an object, the feature being disposed below a surface of the object, the apparatus comprising: a pump radiation source operable to irradiate the surface of the object with a pulsed pump radiation beam so as to produce an acoustic wave in the object; a measurement radiation source operable to irradiate the surface of the object with a measurement radiation beam; and a measurement system operable to receive at least a portion of the measurement radiation beam scattered from the surface and further operable to determine a characteristic of the feature in the object from at least a portion of the measurement radiation beam scattered from the surface within a measurement time period; wherein the pump radiation source is arranged such that a temporal intensity distribution of the pulsed pump radiation beam is such that in the measurement time period a signal to background ratio is greater than a signal to background ratio achieved using a single pulse of the pulsed pump radiation beam, the signal to background ratio being a ratio of: (a) signals generated at the surface by reflections of acoustic waves from the feature to (b) background signals generated at the surface by reflections of acoustic waves which have not reflected from the feature.

The apparatus according to the second aspect of the invention is suitable for implementing the method according to the first aspect of the invention. The apparatus according to the second aspect of the invention may incorporate any features of the method according to the first aspect of the invention as appropriate.

The measurement system may comprise a sensor and a processor. The sensor may be operable to detect radiation scattered from the surface and to output a signal containing information related to a position of the feature. The processor may be configured to receive the signal from the sensor and to determine a position of the feature, for example relative to a substrate table, in dependence thereon.

According to a third aspect of the invention there is provided a method for determining a temporal intensity distribution of a pulsed pump radiation beam for irradiating the surface of an object having a feature disposed below the surface with a pulsed pump radiation beam so as to produce an acoustic wave in the object, the method comprising: determining a temporal intensity distribution of the pulsed pump radiation beam such that in a measurement time period a signal to background ratio is greater than a signal to background ratio achieved using a single pulse of the pulsed pump radiation beam, the signal to background ratio being a ratio of: (a) signals generated at the surface by reflections of acoustic waves from the feature to (b) background signals generated at the surface by reflections of acoustic waves which have not reflected from the feature.

The method according to the third aspect of the present invention allows the method according to the first aspect of the present invention to be carried out.

According to a fourth aspect of the invention there is provided a method for determining a temporal intensity distribution of a pulsed pump radiation beam for irradiating the surface of an object having a feature disposed below the surface with a pulsed pump radiation beam so as to produce an acoustic wave in the object, the method comprising: determining a temporal intensity distribution of the pulsed pump radiation beam such that in a measurement time period a signal to background ratio is substantially maximized, the signal to background ratio being a ratio of: (a) signals generated at the surface by reflections of acoustic waves from the feature to (b) background signals generated at the surface by reflections of acoustic waves which have not reflected from the feature.

Further optional features of the methods according to the third and fourth aspects of the invention are now discussed.

The measurement time period may correspond to a time period during which a portion of an acoustic wave generated by an initial pulse of the pulsed pump radiation beam which is reflected from the feature and not from any other interfaces within the object arrives at the surface.

The temporal intensity distribution of the pulsed pump radiation beam may be determined such that in the measurement time period there is at least partial constructive interference between: (i) a reflected portion of the acoustic wave generated by a first pulse, the reflected portion of the acoustic wave generated by the first pulse having reflected from the feature; and (ii) a reflected portion of the acoustic wave generated by a second pulse, the reflected portion of the acoustic wave generated by the second pulse having also been reflected from the feature.

The temporal intensity distribution of the pulsed pump radiation beam may be determined such that in the measurement time period there is at least partial destructive interference between: (i) a reflected portion of the acoustic wave generated by a first pulse which is not incident on the feature; and (ii) a reflected portion of the acoustic wave generated by a second pulse which is not incident on the feature.

The method for determining a temporal intensity distribution of a pulsed pump radiation beam may be analytical, iterative or a combination of both.

The methods of the third or fourth aspects of the invention may comprise: determining a plurality of acoustic pathways away from and back to the surface based on the structure of the object; for each determined acoustic pathway, determining the time taken for an acoustic pulse to propagate along the acoustic pathway, and an attenuation factor and a phase change for an acoustic pulse propagating along the acoustic pathway; for a pulsed pump radiation beam, determining an acoustic signal at the surface as a superposition of contributions from each pulse propagating along each pathway and determining one or more parameters of the temporal intensity distribution such that in a measurement time period: the ratio of signals generated at the surface by reflections of acoustic waves from the feature to background signals generated at the surface by reflections of acoustic waves which have not reflected from the feature is enhanced.

Such a method uses knowledge of the object to determine the temporal intensity distribution of the pulsed pump radiation beam. The method may use a numerical model, for example a computer implemented numerical model.

The one or more parameters of the temporal intensity distribution may be determined such that: there is at least partial constructive interference between one or more contributions from pathways that reflect from the feature; and/or there is at least partial destructive interference between one or more contributions from pathways that are not incident on the feature.

The methods of the third or fourth aspects of the invention may comprise: irradiating a surface of the object with a pulsed pump radiation beam so as to produce an acoustic wave in the object, the pulsed pump radiation beam having a temporal intensity distribution described by a set of one or more parameters; iteratively varying at least one of the one or more parameters of a temporal intensity distribution of the pulsed pump radiation beam so as to at least partially increase a signal that is indicative of a feature below the surface of the object and/or to at least partially decrease a background signal.

For example, the one or more parameters may comprise one or more parameters which characterize the shape of each pulse and/or a time between each pair of pulses.

An initial set of parameters may be chosen and the surface of the object may be irradiated with the pulsed pump radiation beam having a temporal intensity distribution described by the initial set of parameters. During a measurement time period, one or more aspects of the surface of the object may be monitored and compared to an expected or desired signal based on the (known) feature below the surface. If a difference between the determined signal and the expected or desired signal based is above a threshold then at least one of the one or more parameters may be changed and the surface of the object may be irradiated with the pulsed pump radiation beam having a temporal intensity distribution described by the changed set of parameters. During a measurement time period, one or more aspects or the surface of the object may be monitored and compared to an expected or desired signal based on the (known) feature below the surface.

This process may be repeated until a difference between the determined signal and the expected or desired signal is below the threshold. In some embodiments, the process may be repeated until a local minimum in the difference between the determined signal and the expected or desired signal is found.

With such embodiments, the initial set of parameters may be chosen using an analytical or semi-analytical approach.

The methods of the third or fourth aspects of the invention may comprise: irradiating a surface of the object with a pump radiation beam so as to produce an acoustic wave in the object; measuring a signal generated at the surface of the object; and using the determined signal to determine the temporal intensity distribution of the pulsed pump radiation beam.

For example, the step of irradiating a surface of the object with a pump radiation beam so as to produce an acoustic wave in the object may comprise irradiating the surface of the object with a single pulse of radiation.

The step of measuring a signal generated at the surface of the object may involve measuring a plurality of echoes that correspond to reflected acoustic waves propagating away from and back to the surface along different acoustic pathways. This may be achieved by irradiating the surface of the object with a measurement radiation beam and receiving at least a portion of the measurement radiation beam scattered from the surface. By tuning a time delay between irradiating the surface of the object with the pump radiation beam and irradiating the surface of the object with the measurement radiation beam a plurality of echoes that correspond to reflected acoustic waves propagating away from and back to the surface along different acoustic pathways can be determined.

According to a fifth aspect of the invention there is provided a method for determining a characteristic of a feature in an object, the feature being disposed below a surface of the object, the method comprising: irradiating the surface of the object with a pulsed pump radiation beam so as to produce an acoustic wave in the object; irradiating the surface of the object with a measurement radiation beam; receiving at least a portion of the measurement radiation beam scattered from the surface; and determining a characteristic of the feature in the object from at least a portion of the measurement radiation beam scattered from the surface within a measurement time period; wherein a temporal intensity distribution of the pulsed pump radiation beam is such that in the measurement time period there is at least partial constructive interference between: (i) a reflected portion of the acoustic wave generated by a first pulse, the reflected portion of the acoustic wave generated by the first pulse having reflected from the feature; and (ii) a reflected portion of the acoustic wave generated by a second pulse, the reflected portion of the acoustic wave generated by the first pulse having also been reflected from the feature.

According to a sixth aspect of the invention there is provided a method for determining a characteristic of a feature in an object, the feature being disposed below a surface of the object, the method comprising: irradiating the surface of the object with a pulsed pump radiation beam so as to produce an acoustic wave in the object; irradiating the surface of the object with a measurement radiation beam; receiving at least a portion of the measurement radiation beam scattered from the surface; and determining a characteristic of the feature in the object from at least a portion of the measurement radiation beam scattered from the surface within a measurement time period; wherein a temporal intensity distribution of the pulsed pump radiation beam is such that in the measurement time period there is at least partial destructive interference between: (i) a reflected portion of the acoustic wave generated by a first pulse which is not incident on the feature; and (ii) a reflected portion of the acoustic wave generated by a second pulse which is not incident on the feature.

According to a seventh aspect of the invention there is provided an apparatus for determining a characteristic of a feature in an object, the feature being disposed below a surface of the object, the apparatus comprising: a pump radiation source operable to irradiate the surface of the object with a pulsed pump radiation beam so as to produce an acoustic wave in the object; a measurement radiation source operable to irradiate the surface of the object with a measurement radiation beam; and a measurement system operable to receive at least a portion of the measurement radiation beam scattered from the surface and further operable to determine a characteristic of the feature in the object from at least a portion of the measurement radiation beam scattered from the surface within a measurement time period; wherein the pump radiation source is arranged such that a temporal intensity distribution of the pulsed pump radiation beam is such that in the measurement time period there is at least partial constructive interference between: (i) a reflected portion of the acoustic wave generated by a first pulse, the reflected portion of the acoustic wave generated by the first pulse having reflected from the feature; and (ii) a reflected portion of the acoustic wave generated by a second pulse, the reflected portion of the acoustic wave generated by the first pulse having also been reflected from the feature.

According to an eighth aspect of the invention there is provided an apparatus for determining a characteristic of a feature in an object, the feature being disposed below a surface of the object, the apparatus comprising: a pump radiation source operable to irradiate the surface of the object with a pulsed pump radiation beam so as to produce an acoustic wave in the object; a measurement radiation source operable to irradiate the surface of the object with a measurement radiation beam; and a measurement system operable to receive at least a portion of the measurement radiation beam scattered from the surface and further operable to determine a characteristic of the feature in the object from at least a portion of the measurement radiation beam scattered from the surface within a measurement time period; wherein the pump radiation source is arranged such that a temporal intensity distribution of the pulsed pump radiation beam is such that in the measurement time period there is at least partial destructive interference between: (i) a reflected portion of the acoustic wave generated by a first pulse which is not incident on the feature; and (ii) a reflected portion of the acoustic wave generated by a second pulse which is not incident on the feature.

According to a ninth aspect of the invention there is provided a method for determining a characteristic of a feature in an object, the feature being disposed below a surface of the object, the method comprising: irradiating the surface of the object with a pump radiation beam so as to produce an acoustic wave in the object; irradiating the surface of the object with a measurement radiation beam; receiving at least a portion of the measurement radiation beam scattered from the surface; and determining a characteristic of the feature in the object from at least a portion of the measurement radiation beam scattered from the surface within a measurement time period; wherein a temporal intensity distribution of the pump radiation beam is selected such that in the measurement time period a signal to background ratio is substantially maximized, the signal to background ratio being a ratio of: (a) signals generated at the surface by reflections of acoustic waves from the feature to (b) background signals generated at the surface by reflections of acoustic waves which have not reflected from the feature.

The method according to the ninth aspect of the invention may incorporate any features of the method according to the first aspect of the invention as appropriate.

According to a tenth aspect of the invention there is provided an apparatus for determining a characteristic of a feature in an object, the feature being disposed below a surface of the object, the apparatus comprising: a pump radiation source operable to irradiate the surface of the object with a pulsed pump radiation beam so as to produce an acoustic wave in the object; a measurement radiation source operable to irradiate the surface of the object with a measurement radiation beam; and a measurement system operable to receive at least a portion of the measurement radiation beam scattered from the surface and further operable to determine a characteristic of the feature in the object from at least a portion of the measurement radiation beam scattered from the surface within a measurement time period; wherein the pump radiation source is arranged such that a temporal intensity distribution of the pulsed pump radiation beam is such that in the measurement time period a signal to background ratio is substantially maximized, the signal to background ratio being a ratio of: (a) signals generated at the surface by reflections of acoustic waves from the feature to (b) background signals generated at the surface by reflections of acoustic waves which have not reflected from the feature.

The apparatus according to the tenth aspect of the invention is suitable for implementing the method according to the ninth aspect of the invention. The apparatus according to the tenth aspect of the invention may incorporate any features of the method according to the ninth aspect of the invention as appropriate.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1B:
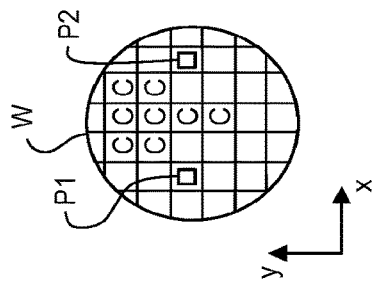
FIG. 1B shows a plan view of a substrate W which may represent either of the two substrates of FIG. 1A.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate Immersion techniques are well known in the art for increasing the numerical aperture of projection systems.

Figure 1C:
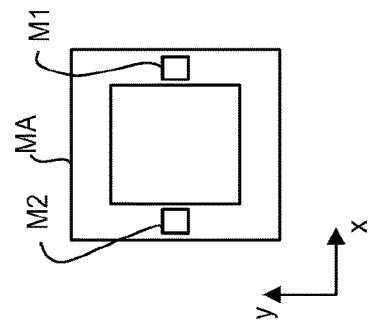
FIG. 1C shows a plan view of a patterning device, which may be used by the lithographic system of FIG. 1A.
Figure 1A:
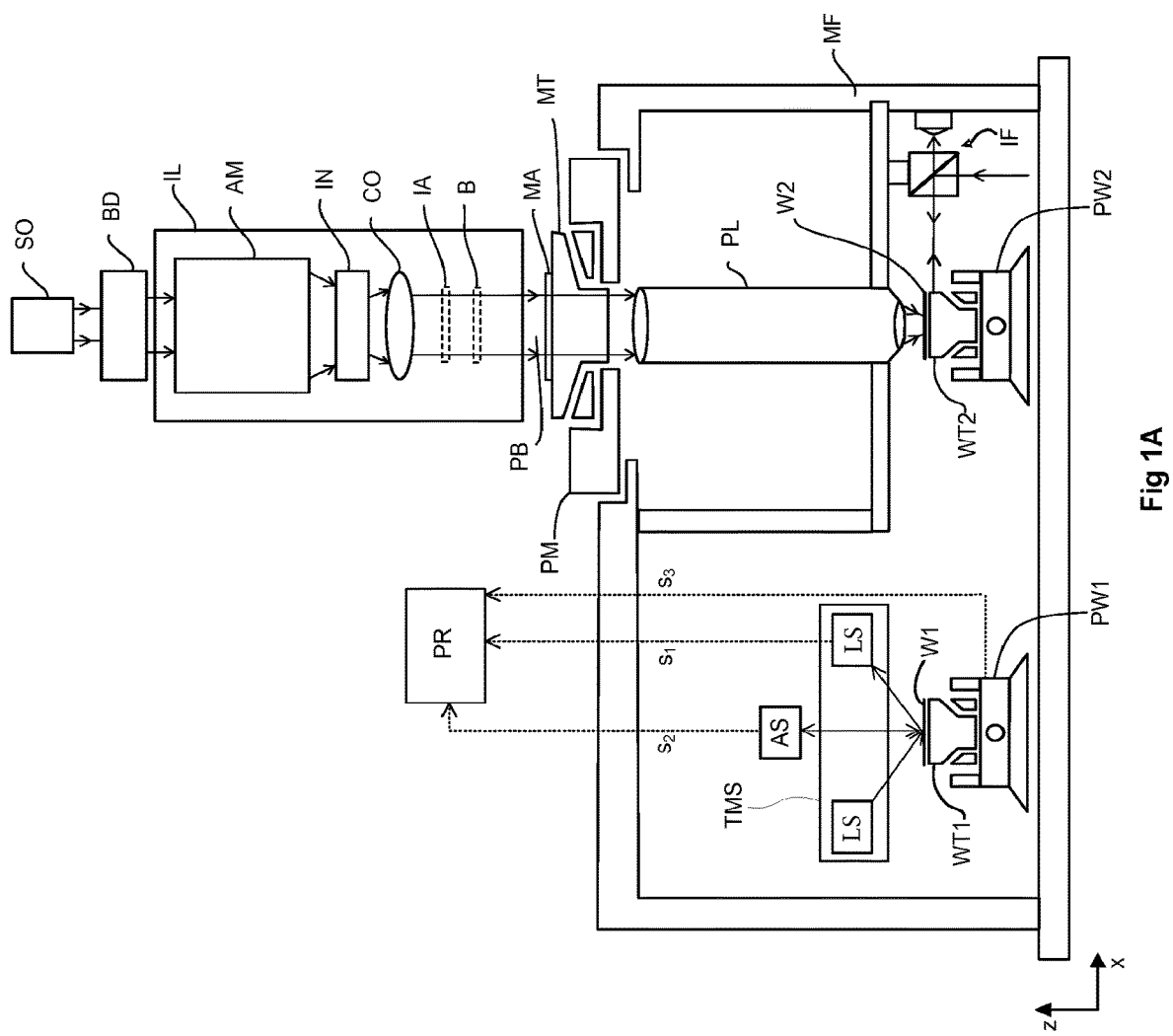
FIG. 1A schematically depicts a lithographic system comprising an alignment system according to an embodiment of the invention.

FIG. 1A schematically depicts a lithographic apparatus according to a particular embodiment of the invention. The apparatus comprises:

an illumination system (illuminator) IL for conditioning a beam PB of radiation (e.g. UV radiation or DUV radiation);

a frame MF;

a support structure (e.g. a mask table) MT to support a patterning device (e.g. a mask) MA;

two substrate tables (e.g. a wafer table) WT1, WT2, each for holding a substrate (e.g. a resist coated wafer) W1, W2 respectively; and a projection system (e.g. a refractive projection lens) PL configured to image a pattern imparted to the radiation beam PB by patterning device MA onto a target portion C (e.g. comprising one or more dies) of a substrate W held by one of the two substrate tables WT1, WT2.

The frame MF is a vibration isolated frame that is substantially isolated from external influences such as vibrations. For example, the frame MF may be supported by a base frame (not shown) on the ground via acoustically damping mounts (not shown), so as to isolate the frame MF from vibrations of the base frame. These acoustically damping mounts may be actively controlled to isolate vibrations which are introduced by the base frame and/or by the isolated frame MF itself.

In the dual stage lithographic apparatus depicted in FIG. 1A an alignment system AS and a topography measurement system TMS are provided on the left-hand side and the projection system PL is provided on the right-hand side. The projection system PL, alignment system AS and topography measurement system TMS are connected to the isolated frame MF.

The support structure MT is movably mounted to the frame MF via a first positioning device PM. The first positioning device PM may be used to move the patterning device MA, and to accurately position it, relative to the frame MF (and the projection system PL which is connected to the frame MF).

The substrate tables WT1, WT2 are movably mounted to the frame MF via first and second substrate positioning devices PW1, PW2 respectively. The first and second substrate positioning devices PW1, PW2 may be used to move substrates W1, W2 held by substrate tables WT1, WT2 respectively, and to accurately position the substrates W1, W2, relative to the frame MF (and the projection system PL, alignment system AS and topography measurement system TMS which are connected to the frame MF). The support structure MT and the substrate tables WT1, WT2 may be referred to collectively as object tables. The first and second substrate positioning devices PW1, PW2 may each be considered to be a scanning mechanism operable to move a substrate table WT1, WT2 along a scanning path relative to the radiation beam such that the radiation beam scans across a target portion C of the substrate W.

The lithographic apparatus shown in FIG. 1A is therefore of a type having two substrate tables WT1, WT2, which may be referred to as a dual stage apparatus. In such "multiple stage" machines the two substrate tables WT1, WT2 are used in parallel, with preparatory steps being carried out on one of the substrates tables while the other substrate table is being used for exposure. The preparatory steps may include mapping the surface of the substrate using a level sensor LS and measuring the position of alignment marks on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

In FIG. 1A, the substrate table WT1 is disposed on the left and the substrate table WT2 is disposed on the right. In this configuration, substrate table WT1 can be used to carry out various preparatory steps in relation to the substrate W1 held thereby using alignment system AS (as will be described more fully below) and topography measurement system TMS prior to exposure of that substrate W1. Simultaneously, the substrate table WT2 can be used for exposure of another substrate W2 held by substrate table WT2. Once the substrate W2 held by substrate table WT2 has been exposed and the preparatory steps in relation to the substrate W1 held by substrate table WT1 have been carried out, the two substrate tables WT1, WT2 swap places. Subsequently, the substrate W1 held by substrate table WT1 is exposed to radiation and the substrate W2 held by substrate table WT2 that has previously been exposed to radiation is replaced with a new substrate and various preparatory steps are performed in relation to the new substrate.

Therefore each of the two substrate tables WT1, WT2 can be disposed either on the left or the right of FIG. 1A. Unless stated otherwise, in the following substrate table WT1 will generally refer to the substrate table with is at that time disposed on the left and substrate table WT2 will generally refer to the substrate table with is at that time disposed on the right.

FIG. 1B shows a plan view of a substrate W which may represent either of the two substrates W1, W2 of FIG. 1A. In the following, unless otherwise stated, substrates on the left and right of the lithographic apparatus will be referred to as substrate W. FIG. 1C shows a plan view of the patterning device MA, which is provided with patterning device alignment marks (schematically depicted as boxes M1, M2).

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as -outer and -inner, respectively) of the intensity distribution in a pupil plane of the illuminator can be adjusted. The illuminator IL may also be operable to vary the angular distribution of the beam in a pupil plane of the illuminator. For example, the illuminator IL may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution, as is known in the art. A desired illumination mode may be obtained by inserting an optic which provides that illumination mode into the illuminator IL.

The illuminator IL may be operable alter the polarization of the beam and may be operable to adjust the polarization using adjusting means AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator IL may be arranged to linearly polarize the radiation beam. The polarization direction of the radiation beam may vary across a pupil plane of the illuminator IL, i.e. the polarization direction of radiation may be different in different regions in the pupil plane of the illuminator IL. The polarization state of the radiation may be chosen in dependence on the illumination mode.

In addition, the illuminator IL generally comprises various other components, such as an integrator IN and a condenser CO. The illuminator IL provides a conditioned beam of radiation PB, having a desired uniformity and intensity distribution in its cross section.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (y direction in FIG. 1) and the length of the slit may correspond to a non-scanning direction (x direction in FIG. 1). In a scan mode, the length of the slit limits the extent in the non-scanning direction of the target portion C that can be exposed in a single dynamic exposure. In contrast, the extent in the scanning direction of the target portion C that can be exposed in a single dynamic exposure is determined by the length of the scanning motion.

The terms "slit", "exposure slit" or "band or radiation" may be used interchangeably to refer to the band of radiation that is produced by the illuminator IL in a plane perpendicular to an optical axis of the lithographic apparatus. This plane may be at, or close to, either the patterning device MA or the substrate W. The terms "slit profile", "profile of the radiation beam", "intensity profile" and "profile" may be used interchangeably to refer to the shape of the (spatial) intensity distribution of the slit, especially in the scanning direction.

The illuminator IL comprises two masking blades (shown schematically in FIG. 1A as B). Each of the two masking blades is generally parallel to the length of the slit, the two masking blades being disposed on opposite sides of the slit. Each masking blade is independently movable between a retracted position wherein it is not disposed in the path of the radiation beam PB and an inserted position wherein it blocks the radiation beam PB. The masking blades are disposed in a plane of the illuminator IL which is conjugate to that of the patterning device MA (and the substrate W). Such a plane may be referred to as a field plane. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The patterning device MA is also disposed in a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

The illuminator IL comprises an intensity adjustor IA (shown schematically in FIG. 1A). The intensity adjustor IA is operable to attenuate the radiation beam on opposing sides of the radiation beam, as now described. The intensity adjustor IA comprises a plurality of movable fingers arranged in pairs, each pair comprising one finger on each side of the slit (i.e. each pair of fingers is separated in the y-direction). The pairs of fingers are arranged along the length of the slit (i.e. extending in the x-direction). Each movable finger is independently movable in the scanning direction (y-direction). That is, the fingers are moveable in a direction perpendicular to the length of the slit. In use, each movable finger is independently movable in the scanning direction. For example, each movable finger may be movable between at least a retracted position wherein it is not disposed in the path of the radiation beam and an inserted position wherein it partially blocks the radiation beam. By moving the fingers, the shape and/or the intensity distribution of the slit can be adjusted.

The field may be in the penumbra of the fingers such that the fingers do not sharply cut off the radiation beam PB. The pairs of fingers may be used to apply a different level of attenuation of the radiation beam PB along the length of the slit.

The fingers may, for example, be used to ensure that the integral of the intensity profile of the radiation beam PB across the width of the slit is substantially constant along the length of the slit.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second substrate positioning device PW2 and position sensor IF (e.g. an interferometric device), the substrate table WT2 can be moved accurately relative to the frame MF, e.g. so as to position different target portions C in the path of the beam PB. Similarly, the first positioning device PM and another position sensor (which is not explicitly depicted in FIG. 1A) can be used to accurately position the patterning device MA with respect to the frame MF, e.g. after mechanical retrieval from a mask library, or during a scan. In general, movement of the object tables MT and WT1, WT2 will be realized with the aid of a long-stroke module (coarse positioning) and a short-stroke module (fine positioning), which form part of the positioning devices PM, PW1 and PW2. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT, relative to the beam of radiation PB that has been conditioned by the illuminator IL, along a scanning path. In an embodiment, the support structure MT is moved linearly in a scanning direction at a constant scan velocity $v_{MT}$. As described above, the slit is orientated such that its width extends in the scanning direction (which coincides with the y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT2.

In order to form an image of the patterning device MA on the substrate W, the substrate table WT2 is moved such that the conjugate point in the plane of the substrate W of each point on the patterning device MA remains stationary with respect to the substrate W. The velocity (both magnitude and direction) of the substrate table WT2 relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the substrate table WT2 should be moved in the opposite direction to the support structure MT. That is, the motion of the substrate table WT2 should be anti-parallel to the motion of the support structure MT. Further, if the projection system PL applies a reduction factor α to the radiation beam PB then the distance travelled by each conjugate point in a given time period will be less than that travelled by the corresponding point on the patterning device by a factor of α. Therefore the magnitude of the velocity $|v_{WT}|$ of the substrate table WT2 should be $|v_{MT}|/\alpha$.

During exposure of a target portion C, the masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus.

Using the scan mode, the lithographic apparatus is operable to expose a target portion C of the substrate W with substantially fixed area to radiation. For example, the target portion C may comprise part of, one or several dies. A single wafer may be exposed to radiation in a plurality of steps, each step involving the exposure of a target portion C followed by a movement of the substrate W. After exposure of a first target portion C, the lithographic apparatus may be operable to move the substrate W relative to the projection system PL so that another target portion C can be exposed to radiation. For example, between exposures of two different target portions C on the substrate W, the substrate table WT2 may be operable to move the substrate W so as to position the next target portion so that it is ready to be scanned through the exposure region.

Alternatively, the depicted apparatus can be used in another mode, wherein the support structure MT is kept essentially stationary holding a programmable patterning device, and the substrate table WT2 is moved or scanned while a pattern imparted to the beam PB is projected onto a target portion C. In this mode, generally a pulsed radiation source is employed and the programmable patterning device is updated as required after each movement of the substrate table WT2 or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described further below, the alignment system AS measures the positions of alignment marks provided on the substrate W (schematically depicted by boxes P1, P2 in FIG. 1B) which is held on left-hand substrate table WT1. In addition, the topography measurement system TMS is used to measure the topography of a surface of the substrate W held on left-hand substrate table WT1. The first substrate positioning device PW1 and a position sensor (which is not explicitly depicted in FIG. 1A) can be used to accurately position the substrate table WT1 relative to the frame MF (and the alignment system AS and the topography measurement system TMS connected thereto).

The topography measurement system TMS may be operable to output a signal $s_1$ that is indicative of the height of the substrate W1. The alignment system AS may be operable to output a signal $s_2$ that is indicative of the position of one or more alignment marks on the substrate W1 or the substrate table WT1. The output signals $s_1$, $s_2$ are received by a processor PR.

The signal $s_1$ output by the topography measurement system TMS may be analyzed by processor PR to determine the height of the substrate W1. The processor PR may be used to generate a map of the topography of the substrate W1. The processor PR may comprise a memory and may be operable to store information relating to the topography of the entire substrate W1. The topography of the surface of a substrate W1 may be referred to as a height map. During exposure of a substrate W (on the right-hand side of FIG. 1A) it is desirable to keep the substrate W in a focal plane of the projection system PL. In order to achieve this, the substrate table WT2 may be moved in the z direction, said movement of the substrate table WT2 being determined in dependence on the topography of the surface of a substrate W (as previously determined by the topography measurement system TMS).

The signal $s_2$ output by the alignment system AS may be analyzed by processor PR to determine the positions of one or more alignment marks on the substrate W1 and the substrate table WT1. The first substrate positioning device PW1 may be operable to move the substrate table WT1 so as to position each alignment mark below the alignment system AS in turn while a position sensor IF (either position sensor IF or another position sensor dedicated to the measurement station) measures the substrate table WT1. As an initial step, the first substrate positioning device PW1 may be used to position one or more alignment marks on the substrate table WT1 below the alignment system AS and the position of each of the alignment marks is determined. Subsequently, the first substrate positioning device PW1 may be used to position one or more alignment marks on the substrate W1 below the alignment system AS and the position of each of the alignment marks is determined. For example, the position of the substrate table WT1 as determined by the position sensor may be recorded while each alignment mark is directly below the alignment sensor AS. Effectively, the measurement of the position of the alignment marks on the substrate table WT1 allows the position of the substrate table WT1 as determined by the position sensor (for example sensor IF) to be calibrated (relative to the frame MF to which the alignment system AS is connected). Measurement of the position of the alignment marks on the substrate W1 allows the position of the substrate W1 relative to the substrate table WT1 to be determined.

The processor PR may be considered to be a digital signal processing system. The processor PR may comprise, e.g., one or more microprocessors or one or more Field-Programmable Gate Arrays (FPGA), etc.

In addition to data from the alignment system AS and the topography measurement system TMS, the processor PR also receives substrate table WT1 position information (see signal $s_3$ in FIG. 1A) from first substrate positioning device PW1 and/or from a position sensor (for example sensor IF). Since the substrate is fixed to (typically via a clamp) the substrate table WT1, the information from the alignment system AS can be used to convert position information relating to the substrate table WT1 to position information relating to the substrate W.

The apparatus may comprise a lithographic apparatus control unit (not shown) which controls all of the movements and measurements of the various actuators and sensors described. The lithographic apparatus control unit may include signal processing and data processing capacity to implement desired calculations relevant to the operation of the apparatus. The processor PR may form part of the lithographic apparatus control unit. In practice, lithographic apparatus control unit may be realized as a system of many sub-units, each handling the real-time data acquisition, processing and control of a subsystem or component within the apparatus. For example, one processing subsystem may be dedicated to servo control of the first and second substrate positioning devices PW1, PW2. Separate units may even handle coarse and fine actuators, or different axes. Another unit might be dedicated to the readout of the position sensor IF (and, if used, another position sensor for the measurement station). Overall control of the apparatus may be controlled by a central processing unit, communicating with these sub-systems processing units, with operators and with other apparatuses involved in the lithographic manufacturing process.

Figure 2:
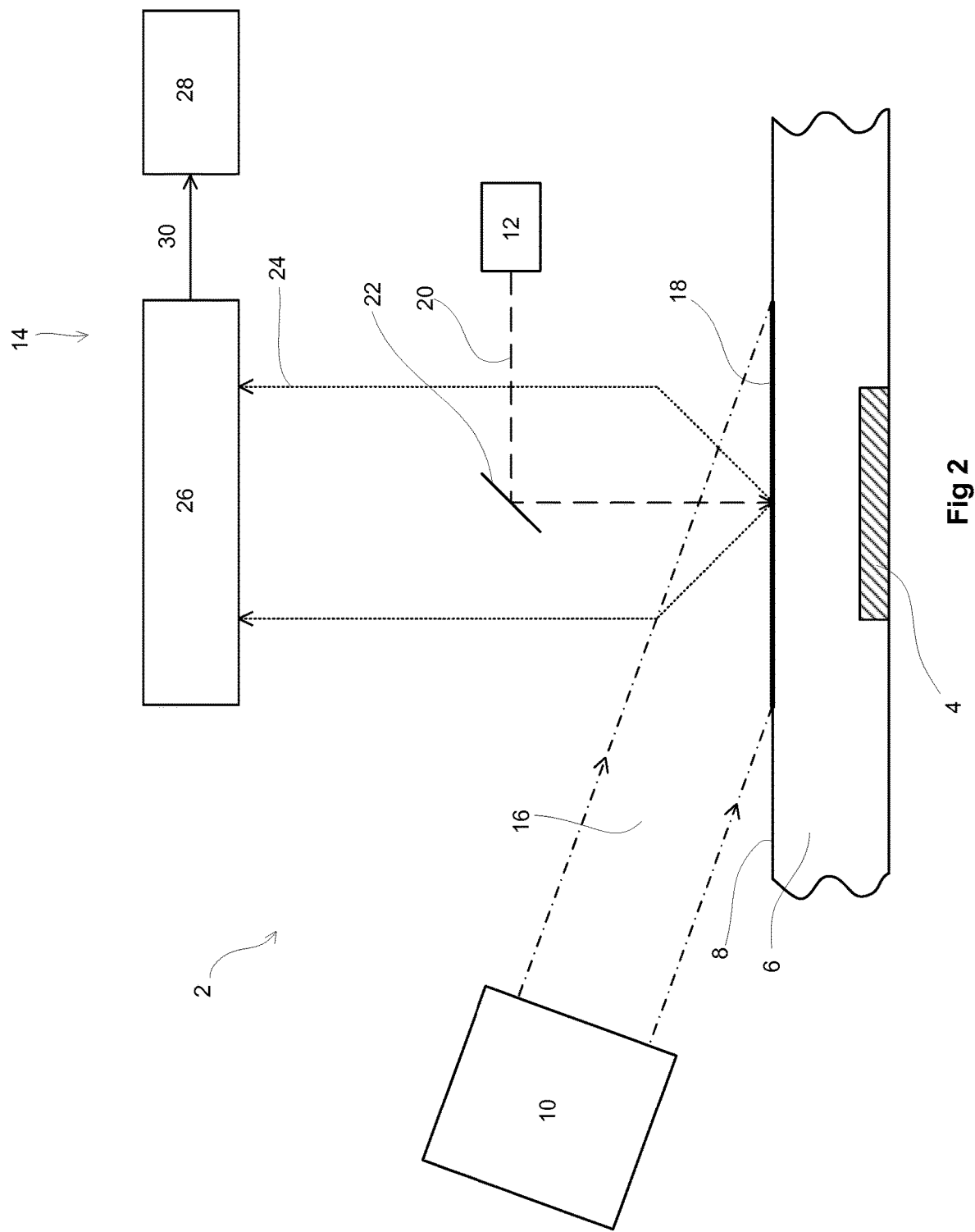
FIG. 2 is a schematic illustration of an apparatus for determining a characteristic of a feature in an object, the feature being disposed below a surface of the object.

FIG. 2 is a schematic illustration of an apparatus 2 for determining a characteristic of a feature 4 in an object 6, the feature 4 being disposed below a surface 8 of the object 6. The object 8 may, for example, be a silicon wafer (for example, as schematically shown as substrate W in FIG. 1B) and the feature 4 may be an alignment mark (for example, as schematically shown as substrate alignment marks P1, P2 in FIG. 1B). The alignment mark may be of the form of a reflective grating. The apparatus comprises a pump radiation source 10, a measurement radiation source 12 and a measurement system 14.

The pump radiation source 10 is operable to irradiate the surface 8 of the object 6 with a pulsed pump radiation beam 16 so as to produce an acoustic wave in the object 6. In particular, pulsed pump radiation beam 16 is incident on a beam spot region 18 of the surface 8 which is disposed above the feature 4. The pulsed pump radiation beam 16 is an ultrafast laser. It is known that such ultrafast lasers can generate acoustic waves inside a variety of different materials. In this process, the optical energy of the pulsed pump radiation beam 16 is converted into photoinduced stress in a region of the object 6. This region of the object 6 within which the acoustic waves are generated may be at, or proximate to, the surface 8. It will be appreciated that the region within which the acoustic waves are generated will be a region that the pulsed pump radiation beam 16 can penetrate to from the surface 8. For example, it may be an opaque layer that is disposed beneath the surface 8. That is, the region within which the acoustic wave is generated may be a layer that is not the top most material in the object 6 (i.e. not the layer closest to the surface 8). For example, there may be a layer of resist on top of (i.e. closer to the surface 8 than) the layer within which the acoustic wave is generated. Additionally or alternatively, there may be one or more layers of material above (i.e. closer to the surface 8 than) the layer within which the acoustic wave is generated such as, for example anti-reflection coatings. The depth of the region within which the acoustic waves are generated is known as the characteristic depth and is dependent both on material properties of the object 6 and characteristics of the pulsed pump radiation beam 16. This process can produce a coherent acoustic wave within the object 6. The acoustic wave may propagate away from the region within which it is generated and, in particular, may propagate away from the surface 8 and through one or more layers of opaque material. Additionally or alternatively, the acoustic wave may be a standing wave.

It will be appreciated by the skilled person that in this context the term ultrafast laser means a laser that outputs pulses with a temporal duration of the order of 100 nanosecond or less. The ultrafast laser may, for example, be operable to output pulses with a temporal duration of the order of hundreds of picoseconds or less. Such ultrafast lasers are typically mode-locked lasers.

The width, or temporal extent, of the acoustic pulses generated is mostly determined by how fast the lattice (in the layer or layers of material within the characteristic depth from the surface 8) can react to the pump pulse heating the electrons (i.e. electron-phonon coupling) and how far the electrons can travel in the medium of the layer(s). Typically, the temporal extent of the acoustic pulses is of the order of 10 ps. In turn, the frequency of the acoustic wave generated is approximately equal to the inverse of the temporal duration of the pulses of the acoustic wave. For acoustic pulses with a temporal extent of the order of 10 ps, the frequency will be of the order of 100 GHz.

The acoustic waves propagate at a speed of sound that is dependent on the material through which they propagate. The typical speed of sound in metals is several thousand m/s. For example, the speed of sound in gold is of the order of 6000 m/s. The wavelength of the acoustic waves in a given material is given by the ratio of the speed of sound in that material to the frequency of the acoustic waves (which, as explained above, is mainly dependent on properties of the material(s) close to the surface 8 of the object 6). For a speed of sound in the range 1,000 to 10,000 m/s and a frequency of the order of 100 GHz, the wavelength of the acoustic waves will be of the order of 10 to 100 nm. For acoustic pulses with a temporal extent of the order of 100 ps, the frequency will be of the order of 10 GHz. For a speed of sound in the range 1000 to 10,000 m/s and a frequency of the order of 10 GHz, the wavelength of the acoustic waves will be of the order of 100 to 1000 nm.

It will be appreciated that any discussion of specific values or ranges for any of the following quantities contained herein is by way of example only: the temporal duration of pulses of the pulsed pump radiation beam 16, the frequency of the acoustic wave generated, the speed of sound in the object and the wavelength of the acoustic waves. It will be appreciated that embodiments of the present invention can have values of these quantities which differ from those discussed above.

The measurement radiation source 12 is operable to irradiate the surface 8 of the object 6 with a measurement radiation beam 20. In the embodiment shown in FIG. 2, the measurement radiation beam 20 is projected into the surface 8 via a reflective optical element 22 (for example a mirror).

The measurement system 14 is operable to receive at least a portion 24 of the measurement radiation beam 20 scattered from the surface 8. In this context, it will be appreciated that the at least a portion 24 of the measurement radiation beam 20 that is scattered from the surface 8 may be scattered from a region of the body 6 proximate to the surface 8, which region may include a surface of a layer in which the acoustic waves were generated. The measurement system 14 is further operable to determine a characteristic of the feature 4 in the object 6 from at least a portion 24 of the measurement radiation beam 20 scattered from the surface 8 within a measurement time period. The measurement system 14 may be operable to determine a position of the feature 4 (for example an alignment mark) in the object 6 from the portion 24 of the measurement radiation beam 20 scattered from the surface 8 within the measurement time period.

The apparatus 2 shown in FIG. 2 may be referred to as a pump-probe apparatus and may be used to implement methods that may be referred to as pump-probe methods. The pump radiation source 10 is operable to irradiate the surface 8 of the object 6 with a pulsed pump radiation beam 16 so as to produce an acoustic wave in the object 6. The measurement radiation source 12 is operable to irradiate the surface 8 of the object 6 with a measurement radiation beam 20, which can be used to detect or probe these optically generated acoustic waves. It is known that acoustic waves give rise to two effects that are observable with optical methods: (1) the propagating strain causes a displacement of the metal lattice; and (2) the stress related to the acoustic waves induces changes of the dielectric constant via photo-elastic effects.

The measurement system 14 comprises a sensor 26 and a processor 28. The sensor 26 is operable to detect the radiation 24 scattered from the surface 8 and to output a signal 30 containing information related to a position of the feature 4. The processor 28 is configured to receive the signal 30 from the sensor 26 and to determine a position of the feature 4, for example relative to a substrate table, in dependence thereon.

In one embodiment, the pulsed pump radiation beam 16 may comprise pulses with a temporal extent of around 50 fs. In another embodiment, the pulsed pump radiation beam 16 may comprise pulses with a temporal extent of around 1 ps. The pulsed pump radiation beam 16 may have any suitable wavelength as desired. The wavelength of the pulsed pump radiation beam 16 may be chosen so as to reduce the exposure of photoresists on the substrate W. In some embodiments, the pulsed pump radiation beam 16 may have a wavelength of around 400 nm. In some embodiments, the pulsed pump radiation beam 16 may have a wavelength of greater than 400 nm so as to further reduce the exposure of photoresists on the substrate W. In some embodiments, the pulsed pump radiation beam 16 may have a wavelength in the range 400 to 800 nm.

The measurement radiation beam 20 may comprise pulses with a temporal extent which is of the same order of magnitude as the temporal extent the pulses of the pulsed pump radiation beam 16. The measurement radiation beam 20 may have any suitable wavelength as desired. The wavelength of the measurement radiation beam 20 may be chosen so as to reduce the exposure of photoresists on the substrate W. In some embodiments the measurement radiation beam 20 may have a wavelength in the range 400 to 800 nm. For example, in some embodiments the measurement radiation beam 20 may have a wavelength of the order of 500 nm.

The acoustic wave generated by the pulsed pump radiation beam 16 may propagate through the object 6 and a portion of it may be reflected by the feature 4 and propagate back to the surface 8. Embodiments of the invention have particular application to objects that comprise an opaque material (for example having an opaque layer formed from metal) through which electromagnetic radiation cannot propagate. The acoustic waves allow the feature 4 to be probed through such opaque layers.

Embodiments of the invention have particular application to objects that comprise a plurality of layers of materials, for example a substrate W on which a plurality of layers of an integrated circuit have been formed. In general, every interface between two layers of material with different acoustic properties will produce an acoustic reflection. That is, a portion of an acoustic wave incident on any such interface will be reflected (and another portion will be transmitted). The amplitude of the reflected portion and phase shift of the reflected portion (relative the incident wave) depends on the material properties of the respective layers. For a silicon wafer comprising multiple process layers, each interface between adjacent layers gives rise to an acoustic reflection, leading to a highly complex acoustic echo formed at the surface 8 of the object 6 that may obscure the signal from the feature 4 (for example an alignment grating). Furthermore, the presence of many reflecting layers will attenuate the achievable acoustic signal from a feature 4 disposed below the surface 8.

A signal formed at the surface 8 of the object 6 is a superposition of many such reflections, which may interfere constructively or destructively depending on their relative phases. In the following, a signal to background ratio is defined as a ratio of: (a) signals generated at the surface 8 by reflections of acoustic waves from the feature 4 to (b) background signals generated at the surface 8 by reflections of acoustic waves which have not reflected from the feature 4. Again, in this context, it will be appreciated that signals generated at the surface 8 may include signals generated in a region of the body 6 proximate to the surface 8, which region may include a surface of a layer in which the acoustic waves were generated.

Embodiments of the invention relate to an apparatus and an associated method of indirectly probing or measuring a feature 4 disposed below the surface 8 of an object 6 which involve a selection, choice or optimization of the temporal intensity distribution of the pulsed pump radiation beam 16 so as to improve the measurement of the feature 4 during a measurement time period. For example, the pump radiation source 10 may be arranged such that a temporal intensity distribution of the pulsed pump radiation beam 16 is such that in a measurement time period the signal to background ratio is substantially maximized. Additionally or alternatively, the pump radiation source 10 may be arranged such that a temporal intensity distribution of the pulsed pump radiation beam 16 is such that in a measurement time period the signal to background ratio is greater than a signal to background ratio achieved using a single pulse of the pulsed pump radiation beam. By selecting the temporal intensity distribution of the pulsed pump radiation beam 16 in this way, the energy dose of each individual pulse of the pulsed pump radiation beam 16 can be reduced while still achieving a sufficient strength of signal to determine a characteristic of the feature 4 (for example its position). In particular, the energy dose of each individual pulse of the pulsed pump radiation beam 16 can be below a damage threshold of the object 6.

It will be appreciated that a pulsed radiation beam comprises a plurality of pulses of radiation. It will be further appreciated that the temporal intensity distribution of a pulsed radiation beam is dependent on: (a) the shape of each pulse; and (b) the time between each pair of pulses. The shape of a pulse may characterized by one or more parameters. For example, each pulse may be generally Gaussian shaped and the shape of such a pulse may be characterized by a width parameter and a height parameter. It will be further appreciated that different pulses may have different shapes. It will be further appreciated that the time between one pair of pulses may differ from the time between another pair of pulses. It will be further appreciated that the plurality of pulses may be temporally resolved. Alternatively, consecutive pluses may partially overlap so as to form a combined waveform.

The measurement time period (in which the increase in signal to background ratio is achieved) may correspond to a time period during which a portion of an acoustic wave generated by an initial pulse of the pulsed pump radiation beam 16 which is reflected from the feature 4 and not from any other interfaces within the object 6 arrives at the surface 8. From an initial pulse of the pulsed pump radiation beam 16 an acoustic wave is generated that propagates away from the surface 8. A portion of this acoustic wave will propagate straight to the feature 4, reflect from the feature 4 and propagate straight back to the surface 8. This may be referred to as a primary signal generated by the initial pulse. The measurement time period may correspond to the time at which this primary signal arrives at the surface 8.

It will be appreciated that as used herein an initial pulse is intended to mean a pulse which initiates a primary signal. It may or may not be the first pulse incident on the surface 8. Some embodiments may involve determining one or more characteristics of the feature 4 in the object 6 from at least a portion 24 of the measurement radiation beam 20 scattered from the surface 8 within a plurality of measurement time periods. For example, the pulsed pump radiation beam 16 may comprise a pulse train having more than two pulses. It will be appreciated that as used herein an initial pulse is intended to mean any pulse which initiates a primary signal. Each of a plurality of measurement time periods may correspond to the arrival time of a primary signal from a different initial pulse of the pulsed pump radiation beam 16.

In some embodiments, the temporal intensity distribution of the pulsed pump radiation beam 16 may be such that in the measurement time period there is at least partial constructive interference between: (i) a reflected portion of the acoustic wave generated by a first pulse, the reflected portion of the acoustic wave generated by the first pulse having reflected from the feature 4; and (ii) a reflected portion of the acoustic wave generated by a second pulse, the reflected portion of the acoustic wave generated by the second pulse having also been reflected from the feature 4. This is now illustrated with reference to FIGS. 3 to 7.

Figure 3:
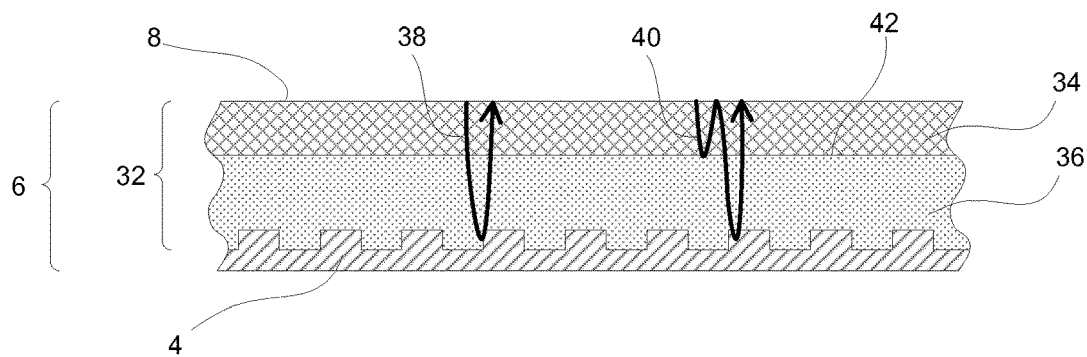
FIG. 3 is a schematic cross section of a portion of a first object which comprises a feature disposed below the surface.

FIG. 3 is a schematic cross section of a portion of an object 6 which comprises a feature 4 disposed below the surface 8. In this example, the feature 4 is of the form of a reflective diffraction grating. A portion 32 of the object 8 that is disposed above the feature 4 comprises two layers 34, 36. As explained above, typically, the acoustic waves may be generated in a region of the object 6 which is not the layer closest to the surface 8. For example, there may be one or more layers of material (for example resist and anti-reflection coatings) provided above (i.e. closer to the surface 8 than) the layer within which the acoustic wave is generated. For ease of understanding, no such layers are shown in FIG. 3.

Also shown schematically in FIG. 3 are first and second acoustic pathways 38, 40 away from and back to the surface 8. Each of the first and second acoustic pathways 38, 40 involves a reflection from the feature 4. The first acoustic pathway 38 corresponds to a portion of an acoustic wave that propagates from the surface 8, straight to the feature 4, reflects from the feature 4 and propagates straight back to the surface 8. This first acoustic pathway corresponds to a primary signal generated by a pulse of the pulsed pump radiation beam 16. The second acoustic pathway 40 corresponds to a portion of an acoustic wave that, in addition to reflecting from the feature 4, also reflects from an interface 42 between two layers of material 34, 36 disposed above the feature 4 and from the surface 8. In particular, the second acoustic pathway 40 corresponds to a portion of an acoustic wave that propagates from the surface 8, reflects from the interface 42, reflects from the surface 8, reflects from the feature 4 and propagates straight back to the surface 8. This second acoustic pathway 40 may be considered to correspond to a secondary signal generated by a pulse of the pulsed pump radiation beam 16.

Figure 4:
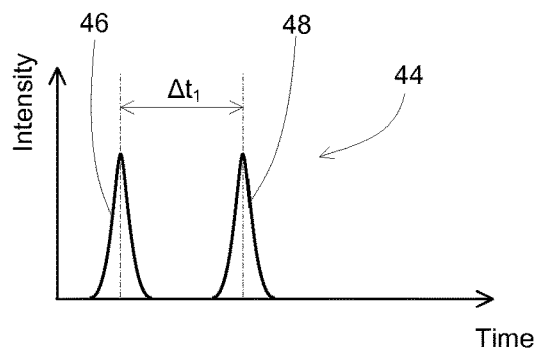
FIG. 4 shows a temporal intensity distribution of a pulsed pump radiation beam that may be used to by the apparatus shown in FIG. 2 when probing the object shown in FIG. 3.

FIG. 4 shows a temporal intensity distribution 44 of the pulsed pump radiation beam 16 that may be used by apparatus 2. The temporal intensity distribution 44 comprises two Gaussian-like pulses 46, 48 with a temporal separation $\Delta t_1$.

Figure 5:
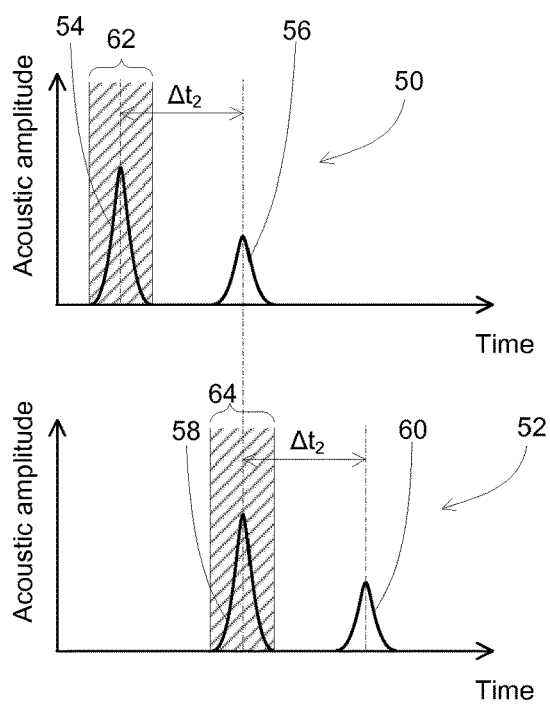
FIG. 5 shows acoustic signals generated at the surface by each of the two pulse of the pulsed pump radiation beam shown in FIG. 4.

FIG. 5 shows an acoustic signal 50 generated at the surface 8 by the first pulse 46 of the pulsed pump radiation beam 16 and an acoustic signal 52 generated at the surface 8 by the second pulse 48 of the pulsed pump radiation beam 16. The acoustic signal 50 generated at the surface 8 by the first pulse 46 of the pulsed pump radiation beam 16 comprises a primary signal 54 corresponding to the first acoustic pathway 38 (see FIG. 3) and a secondary signal 56 corresponding to the second acoustic pathway 40. Similarly, the acoustic signal 52 generated at the surface 8 by the second pulse 48 of the pulsed pump radiation beam 16 comprises a primary signal 58 corresponding to the first acoustic pathway 38 (see FIG. 3) and a secondary signal 60 corresponding to the second acoustic pathway 40. The secondary signals 56, 60 are generally of lower amplitude than the primary signals 54, 58.

Also shown in FIG. 5 are two measurement time periods 62, 64, each of which corresponds to the time at which a primary signal 54, 58 arrives at the surface 8. A temporal extent of the measurement time periods 62, 64 generally corresponds to a temporal extent of the pulses of acoustic waves generated, which may for example be of the order of 10 ps. It will be appreciated that in some embodiments, the temporal extent of the measurement time periods 62, 64 may be greater than the temporal extent of the acoustic pulses generated at the surface 8 so as to take into account any temporal broadening of the primary signal caused by the propagation of the acoustic wave through the object 6. A time delay between the arrival of a pulse 46, 48 of the pulsed pump radiation beam 16 at the surface 8 and the arrival of the primary signal 54, 58 corresponds to the time of flight of an acoustic wave from the surface 8 to the feature 4 and back to the surface 8. This is related to the speed of sound in each of the two layers 34, 36 of material and the thickness of each of the two layers 34, 36 of material.

Each primary signal 54, 58 is separated from the corresponding secondary signal 56, 60 (i.e. the secondary signal that originates from the same pulse of the pulsed pump radiation beam) by a time $\Delta t_2$. The time $\Delta t_2$ is the additional time taken for the secondary signals 56, 60 to reach the surface 8 as compared to the primary signals 54, 58. In general the time $\Delta t_2$ is dependent on the thickness of any additional layers of material traversed and the speed of sound in such layers. In this example, the time $\Delta t_2$ is equal to twice the thickness of layer 34 divided by the speed of sound in layer 34.

Figure 6:
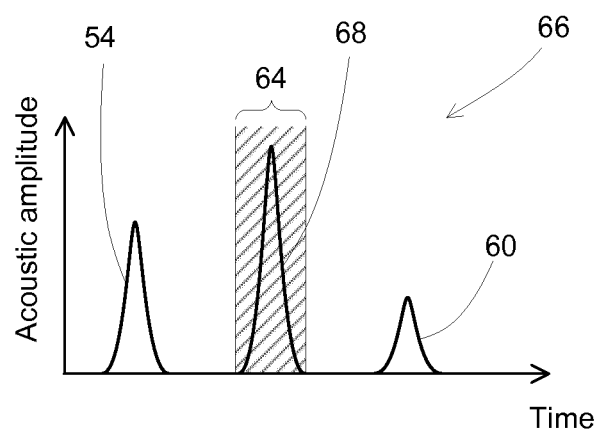
FIG. 6 shows the total acoustic amplitude formed at the surface of the object by the pulsed pump radiation beam shown in FIG. 4.

The total acoustic amplitude 66 formed at the surface 8 of the object 6 is shown in FIG. 6. The total acoustic amplitude 66 a superposition of the acoustic signals 50, 52 generated at the surface 8 by the two pulses 46, 48 of the pulsed pump radiation beam 16. The total acoustic amplitude 66 comprises a peak 54 which corresponds to the primary signal 54 corresponding to the first acoustic pathway 38 and a peak 60 which corresponds to the secondary signal 60 corresponding to the second acoustic pathway 40. The secondary signal 56 corresponding to the first acoustic pathway 38 and the primary signal 58 corresponding to the second acoustic pathway 40 have constructively interfered to form an enhanced peak 68 in measurement time period 64.

Figure 7:
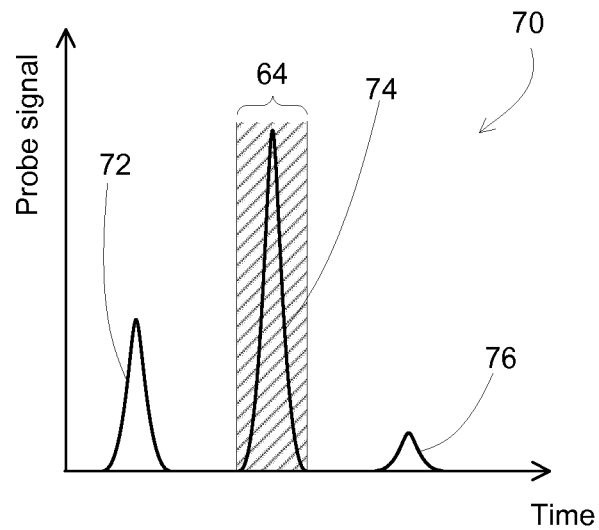
FIG. 7 shows a probe signal that can be determined by the measurement radiation beam from the total acoustic amplitude shown in FIG. 6.

FIG. 7 shows the probe signal 70 that can be determined by the measurement radiation beam 20. The probe signal 70 comprises a peak 72, 74, 76 which corresponds to each of the peaks 54, 68, 60 of the total acoustic amplitude 66. The probe signal 70 typically scales with the square of the acoustic amplitude 66. Therefore, the constructive interference as described above results in a greater enhancement of the probe signal 72 in the measurement time period 64 (compare peaks 74 and 72) than the enhancement of the acoustic amplitude 66 signal in the measurement time period 64 due to the constructive interference as described above (compare peaks 68 and 54). If the two signals which constructively interfere have approximately equal amplitude then an enhancement in the probe signal of a factor of 4 can be achieved in the measurement time period 64.

It will be appreciated that, in order for two reflected portions of acoustic signal to constructively interfere at the surface 8, there should be at least some temporal overlap between the arrival of the two reflected portions at the surface and the two signals should be substantially in phase. Temporal overlap of the secondary signal 56 corresponding to the first acoustic pathway 38 and the primary signal 58 corresponding to the second acoustic pathway 40 is ensured by choosing the temporal separation $\Delta t_1$ of the two pulses 46, 48 of the pulsed pump radiation beam 16 to be equal to the additional time $\Delta t_2$ taken for the secondary signals 56, 60 to reach the surface 8 as compared to the primary signals 54, 58.

In the arrangement shown in FIGS. 4 to 7, there is complete temporal overlap between the secondary signal 56 corresponding to the first acoustic pathway 38 and the primary signal 58 corresponding to the second acoustic pathway 40. With such an arrangement, in order for the secondary signal 56 corresponding to the first acoustic pathway 38 and the primary signal 58 corresponding to the second acoustic pathway 40 to be substantially in phase, the total phase change caused by the additional reflections in the second acoustic pathway should be zero. In general, when an acoustic wave propagating through a first medium reflects from the interface with a second medium then the change in phase of the reflected wave (relative to that of the incident wave) is dependent on the acoustic impedances of the two media. If the acoustic impedance of the first medium is higher than that of the second medium then there will be a change in phase of 180° whereas if the acoustic impedance of the first medium is lower than that of the second medium then there will be no change in phase. Therefore, in order for the secondary signal 56 corresponding to the first acoustic pathway 38 and the primary signal 58 corresponding to the second acoustic pathway 40 to be substantially in phase, the acoustic impedance of the layer 34 should be either lower than the acoustic impedance of both the layer 36 and the medium within which the object 6 is immersed or higher than the acoustic impedance of both the layer 36 and the medium within which the object 8 is immersed. If the acoustic impedance of layer 34 is lower than the acoustic impedance of both the layer 36 and the medium within which the object 6 is immersed then there will be no phase change either at the reflection from the interface 42 or at the reflection from surface 8. If the acoustic impedance of layer 34 is higher than the acoustic impedance of both the layer 36 and the medium within which the object 6 is immersed then there will be a phase change of 180° at the reflection from the interface 42 and a phase change of 180° at the reflection from surface 8, resulting in no net phase change.

In some embodiments the object 6 may be a silicon wafer containing a plurality of process layers covering an alignment mark. For such embodiments, the surrounding medium may be air or a vacuum and will generally have a relatively low acoustic impendance. Alternatively, as explained above, there surrounding medium of the arrangement shown in FIG. 3 may be a layer of resist.

In alternative embodiments, the secondary signal 56 corresponding to the first acoustic pathway 38 and the primary signal 58 corresponding to the second acoustic pathway 40 may be substantially in phase even if the total phase change caused by the additional reflections in the second acoustic pathway is not zero for example if it is approximately 180°, as now explained. This would be the case, for example, if there is no phase change at one interface and a phase change of approximately 180° at the other interface. For example, consider an arrangement wherein the acoustic wave is of the form of a continuous waveform (i.e. a wave with a constant amplitude and frequency). With such an arrangement, the temporal separation $\Delta t_1$ of the two pulses 46, 48 of the pulsed pump radiation beam 16 may be chosen such that it differs from the additional time $\Delta t_2$ taken for the secondary signals 56, 60 to reach the surface 8 as compared to the primary signals 54, 58 by half of the acoustic wavelength. That is, the temporal separation $\Delta t_1$ of the two pulses 46, 48 of the pulsed pump radiation beam 16 may be chosen such that an extra half period of the acoustic wave fits inside a double pass of layer 34. Alternatively, consider an arrangement wherein the acoustic wave is of the form of a single short pulse. Such a single short pulse typically comprises either a short period of negative strain (i.e. compression) followed by a short period of positive strain (i.e. dilatation). A phase shift of 180° inverts this signal such that it becomes a dilatation followed by compression. If two such signals overlap completely then they will destructively interfere. However, if the pulses partially overlap such that, for example, the compression parts of the two pulses overlap then the resultant signal comprises a dilatation followed by an enhanced compression followed by a dilatation. In practice, the acoustic waves generated are unlikely to be well described by either of these two extreme cases (continuous waveform or single short pulse) but rather will be somewhere between these two extreme cases. However, in any case by suitable choice of the temporal separation $\Delta t_1$ of the two pulses 46, 48 of the pulsed pump radiation beam 16 it can be arranged such that the secondary signal 56 corresponding to the first acoustic pathway 38 and the primary signal 58 corresponding to the second acoustic pathway 40 constructively interfere, irrespective of the total phase change caused by the additional reflections in the second acoustic pathway.

An arrangement wherein the temporal intensity distribution of the pulsed pump radiation beam 16 is such that in a measurement time period there is at least partial constructive interference between: (i) a reflected portion of the acoustic wave generated by a first pulse, the reflected portion of the acoustic wave generated by the first pulse having reflected from the feature 4; and (ii) a reflected portion of the acoustic wave generated by a second pulse, the reflected portion of the acoustic wave generated by the second pulse having also been reflected from the feature 4 generally enhances signals generated by reflections of the acoustic waves from the feature 4. This is advantageous because it can allow a measurable signal to be achieved with a reduced intensity of the pulsed pump radiation beam 16. Advantageously, this can reduce the risk of the object 6 being damaged by the individual pulses (for example it can be ensured that each pulse has an energy below a damage threshold of the object 6).

In some embodiments, the temporal intensity distribution of the pulsed pump radiation beam 16 may be such that in the measurement time period there is at least partial destructive interference between: (i) a reflected portion of the acoustic wave generated by a first pulse which is not incident on the feature 4; and (ii) a reflected portion of the acoustic wave generated by a second pulse which is not incident on the feature 4. This is now illustrated with reference to FIGS. 8 to 11.

Figure 8:
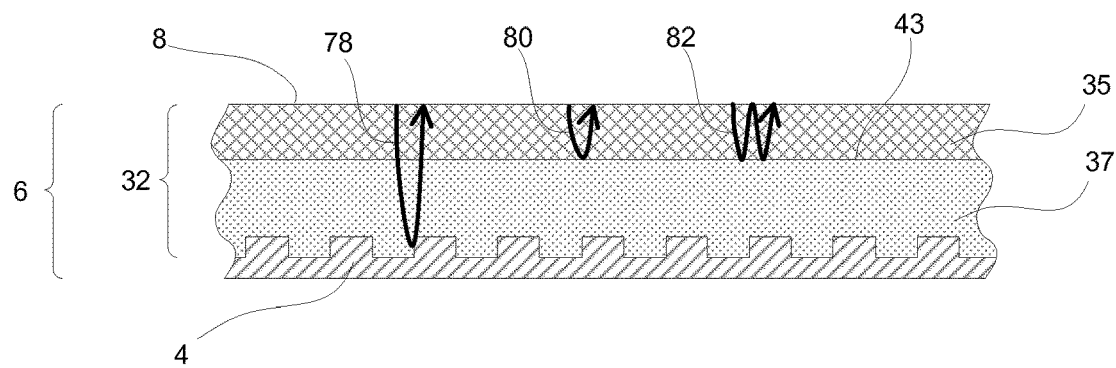
FIG. 8 is a schematic cross section of a portion of a second object which comprises a feature disposed below the surface.

FIG. 8 is a schematic cross section of a portion of an object 6 which comprises a feature 4 disposed below the surface 8. The object shown in FIG. 8 is generally of the same form of the object shown in FIG. 3, with a portion 32 of the object 8 that is disposed above the feature 4 (in this example a reflective diffraction grating) comprising two layers 35, 37. However, in order for the two layers 35, 37 to have the appropriate acoustic properties (as discussed below), it will be understood that, in general, the layers 35, 37 of the object 6 shown in FIG. 8 may comprise different materials to the layers 34, 36 of the object 6 shown in FIG. 3. As explained above, typically, the acoustic waves may be generated in a region of the object 6 which is not the layer closest to the surface 8. For example, there may be one or more layers of material (for example resist and anti-reflection coatings) provided above (i.e. closer to the surface 8 than) the layer within which the acoustic wave is generated. For ease of understanding, no such layers are shown in FIG. 8.

Also shown schematically in FIG. 8 are first, second and third acoustic pathways 78, 80, 82 away from and back to the surface 8. The first acoustic pathway 78 involves a reflection from the feature 4 and may therefore be referred to as a signal. The second and third acoustic pathways 80, 82 do not involve a reflection from the feature 4 and may therefore be referred to as background signals.

The first acoustic pathway 78 corresponds to a portion of an acoustic wave that propagates from the surface 8, straight to the feature 4, reflects from the feature 4 and propagates straight back to the surface 8. This first acoustic pathway corresponds to a primary signal generated by a pulse of the pulsed pump radiation beam 16.

The second acoustic pathway 80 corresponds to a portion of an acoustic wave that propagates to an interface 43 between two layers of material 35, 37 disposed above the feature 4 and reflects back to the surface 8. The third acoustic pathway 82 corresponds to a portion of an acoustic wave that propagates from the surface 8, reflects from the interface 43, reflects from the surface 8, reflects from the interface 43 and propagates back to the surface 8. The second and third acoustic pathways 80, 82 may be considered to correspond to secondary signals generated by a pulse of the pulsed pump radiation beam 16.

Figure 9:
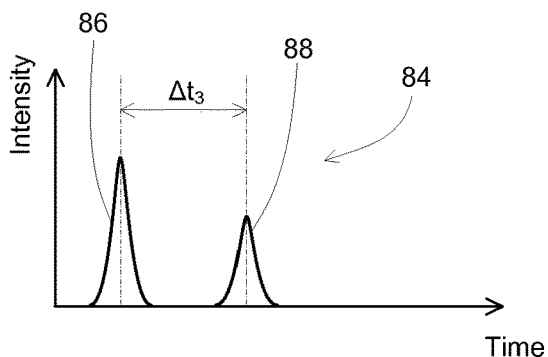
FIG. 9 shows a temporal intensity distribution of a pulsed pump radiation beam that may be used to by the apparatus shown in FIG. 2 when probing the object shown in FIG. 8.

FIG. 9 shows a temporal intensity distribution 84 of the pulsed pump radiation beam 16 that may be used to by apparatus 2. The temporal intensity distribution 84 comprises two Gaussian-like pulses 86, 88 with a temporal separation $\Delta t_3$.

Figure 10:
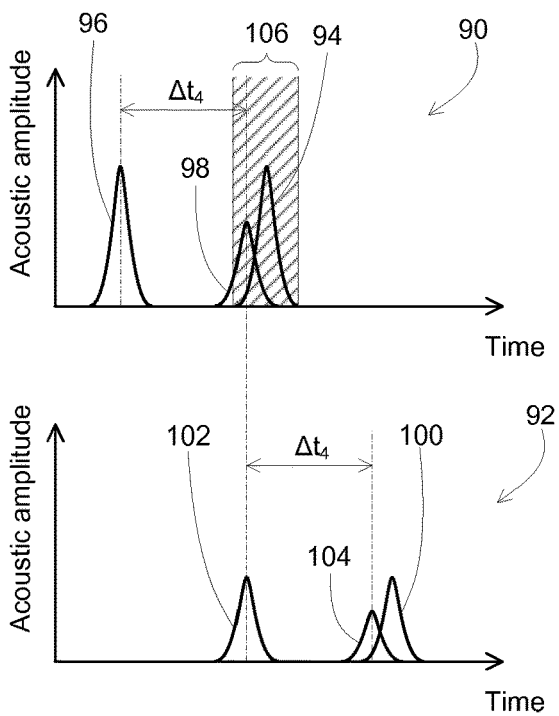
FIG. 10 shows acoustic signals generated at the surface by each of the two pulse of the pulsed pump radiation beam shown in FIG. 9.

FIG. 10 shows an acoustic signal 90 generated at the surface 8 by the first pulse 86 of the pulsed pump radiation beam 16 and an acoustic signal 92 generated at the surface 8 by the second pulse 88 of the pulsed pump radiation beam 16. The acoustic signal 90 generated at the surface 8 by the first pulse 86 of the pulsed pump radiation beam 16 comprises a primary signal 94 corresponding to the first acoustic pathway 78 (see FIG. 8), a secondary signal 96 corresponding to the second acoustic pathway 80 and another secondary signal 98 corresponding to the third acoustic pathway 82. Similarly, the acoustic signal 92 generated at the surface 8 by the second pulse 88 of the pulsed pump radiation beam 16 comprises a primary signal 100 corresponding to the first acoustic pathway 78, a secondary signal 102 corresponding to the second acoustic pathway 80 and another secondary signal 104 corresponding to the third acoustic pathway 82.

Also shown in FIG. 10 is a measurement time period 106, which corresponds to the time at which the primary signal 94 generated by the first pulse 86 arrives at the surface 8. A temporal extent of the measurement time period 106 generally corresponds to a temporal extent of the pulses of acoustic waves generated, which may for example be of the order of 10 ps. It will be appreciated that in some embodiments, the temporal extent of the measurement time period 106 may be greater than the temporal extent of the acoustic pulses generated at the surface 8 so as to take into account any temporal broadening of the primary signal caused by the propagation of the acoustic wave through the object 6. In addition, a time delay between the arrival of the pulse 86 of the pulsed pump radiation beam 16 at the surface 8 and the arrival of the primary signal 94 corresponds to the time of flight of an acoustic wave from the surface 8 to the feature 4 and back to the surface 8. This is related to the speed of sound in each of the two layers 35, 37 of material and the thickness of each of the two layers 35, 37 of material.

It can be seen from FIG. 10 that there is significant temporal overlap between the primary signal 94 and the secondary signal 98 corresponding to the third acoustic pathway 82. This will tend to reduce the signal to background ratio received within the measurement time period 106.

Figure 11:
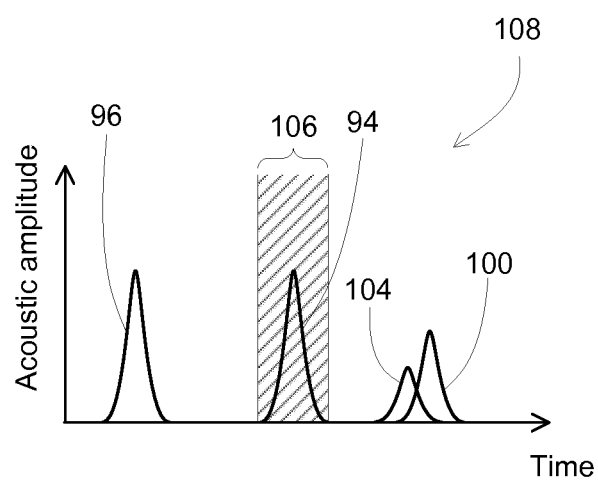
FIG. 11 shows the total acoustic amplitude formed at the surface of the object by the pulsed pump radiation beam shown in FIG. 9.

The total acoustic amplitude 108 formed at the surface 8 of the object 6 is shown in FIG. 11. The total acoustic amplitude 108 is a superposition of the acoustic signals 90, 92 generated at the surface 8 by the two pulses 86, 88 of the pulsed pump radiation beam 16. The total acoustic amplitude 108 comprises the primary signal 94 and the secondary signal 96 corresponding to the second acoustic pathway 80 as generated by the first pulse 86. The total acoustic amplitude 108 further comprises the primary signal 100 and the secondary signal 104 corresponding to the third acoustic pathway 82 as generated by the second pulse 88.

The secondary signal 98 corresponding to the third acoustic pathway 82 from the first pulse 86 and the secondary signal 102 corresponding to the second acoustic pathway 80 from the second pulse 88 have destructively interfered.

It will be appreciated that in order for two reflected portions of acoustic signal to destructively interfere at the surface 8 then there should be at least some temporal overlap between the arrival of the two reflected portions at the surface and the two signals should be substantially out of phase.

Temporal overlap of the secondary signal 98 corresponding to the third acoustic pathway 82 from the first pulse 86 and the secondary signal 102 corresponding to the second acoustic pathway 80 from the second pulse 88 is ensured by choosing the temporal separation $\Delta t_3$ of the two pulses 86, 88 of the pulsed pump radiation beam 16 to be equal to an additional time $\Delta t_4$ taken for the secondary signals 98, 104 corresponding to the third acoustic pathway 82 to reach the surface 8 as compared to the secondary signals 96, 102 corresponding to the second acoustic pathway 80.

In the arrangement shown in FIGS. 9 to 11, there is complete temporal overlap between the secondary signal 98 corresponding to the third acoustic pathway 82 from the first pulse 86 and the secondary signal 102 corresponding to the second acoustic pathway 80 from the second pulse 88. With such an arrangement, in order for the secondary signal 98 corresponding to the third acoustic pathway 82 from the first pulse 86 and the secondary signal 102 corresponding to the second acoustic pathway 80 from the second pulse 88 to be substantially out of phase the total phase change caused by the additional reflections in the third acoustic pathway 82 may be approximately 180°. This can be achieved if the acoustic impedance of the layer 35 is between the acoustic impedance of the layer 37 and the medium within which the object 6 is immersed. Alternatively, the total phase change caused by the additional reflections in the third acoustic pathway 82 may be approximately zero and the temporal separation $\Delta t_3$ of the two pulses 86, 88 of the pulsed pump radiation beam 16 may be tuned to ensure that the secondary signal 98 corresponding to the third acoustic pathway 82 from the first pulse 86 and the secondary signal 102 corresponding to the second acoustic pathway 80 from the second pulse 88 destructively interfere.

In order to ensure maximum destructive interference between the secondary signal 98 corresponding to the third acoustic pathway 82 from the first pulse 86 and the secondary signal 102 corresponding to the second acoustic pathway 80 from the second pulse 88, the intensities of the two pulses 86, 88 of the pulsed pump radiation beam 16 are chosen such that the intensities of the secondary signal 98 corresponding to the third acoustic pathway 82 from the first pulse 86 and the secondary signal 102 corresponding to the second acoustic pathway 80 from the second pulse 88 are substantially equal.

An arrangement wherein the temporal intensity distribution of the pulsed pump radiation beam 16 is such that in a measurement time period there is at least partial destructive interference between: (i) a reflected portion of the acoustic wave generated by a first pulse which is not incident on the feature 4; and (ii) a reflected portion of the acoustic wave generated by a second pulse which is not incident on the feature 4 generally suppresses background signals (which have not reflected from the feature 4). Such background signals may be generated from reflections between the interfaces 35 between different layers of material within the object 6. These background signals can reduce the contrast of a signal formed on the surface 8 of the object 6.

It will be appreciated that the temporal intensity distribution of a pulsed pump radiation beam 16 which achieves an increase in the signal to background ratio in a measurement time period relative to the signal to background ratio achieved using a single pulse of the pulsed pump radiation beam 16 will, in general, be specific to the structure of the object 6. For example, it may be dependent in the number of layers of material from which the object 6 is formed and the thicknesses and acoustic properties of the layers of material. However, it will be apparent to the skilled person how the examples described above can be extended to different object 6 structures so as to result in constructive interference between different signals that have reflected from the feature 4 (as described above with reference to FIGS. 3 to 7) and/or destructive interference between different signals that have not reflected from the feature 4 (as described above with reference to FIGS. 8 to 11).

In some embodiments the temporal intensity distribution of the pulsed pump radiation beam 16 may be selected such that the signal to background ratio generated at the surface 8 in the measurement time period is generally maximized. It will be appreciated that the maximization of the signal to background ratio may involve the selection of one or more parameters of the temporal intensity distribution of the pulsed pump radiation beam 16 that corresponds to, or is proximate to, a local maximum (in this parameter space) of the signal to background ratio. Such parameters may include, for example, the temporal separation between pairs of pulses and/or the relative intensities of sequential pulses of the pulsed pump radiation beam 16.

Although in the above-described examples (as described with reference to FIGS. 3 to 11) the pulsed pump radiation beam 16 comprises a plurality of temporally resolved pulses, it will be appreciated that in some embodiments the consecutive pluses of the pulsed pump radiation beam 16 may partially overlap so as to form a combined waveform. In such embodiments, the temporal intensity distribution of the pulsed pump radiation beam 16 may be such that it appears to comprise a single pulse with an oscillating waveform. In such embodiments, the pump radiation source 10 may be arranged such that a temporal intensity distribution of the pulsed pump radiation beam 16 is such that in a measurement time period the signal to background ratio is substantially maximized. For example, the temporal intensity distribution of the pulsed pump radiation beam 16 may have one or more tunable parameters and the pump radiation source 10 may be arranged such that the parameters are optimized so as to ensure that in the measurement time period the signal to background ratio is substantially maximized.

Although in the above-described examples (as described with reference to FIGS. 3 to 11) the pulsed pump radiation beam 16 is described as comprising two pulses, it will be appreciated that in alternative embodiments the pulsed pump radiation beam 16 may comprise one or more than two pulses. For example, the pulsed pump radiation beam 16 may comprise a train of a plurality of pulses. Furthermore, the skilled person will appreciate how the principles explained above with reference to FIGS. 3 to 11 can be extended such for embodiments with one pulse or more than two pulses can use constructive interference between different signals that have reflected from the feature 4 (as described above with reference to FIGS. 3 to 7) and/or destructive interference between different signals that have not reflected from the feature 4 (as described above with reference to FIGS. 8 to 11) to enhance the signal to background ratio generated at the surface 8 in the measurement time period.

For a given object 6, with a given structure, it may be determined whether or not a particular temporal intensity distribution achieves the desired an increase in signal to background ratio by performing the following methods.

A first method, for determining whether or not a particular temporal intensity distribution achieves an increase in the signal to background ratio in a measurement time period relative to the signal to background ratio achieved using a single pulse of the pulsed pump radiation beam 16, is now described.

First the surface 8 of the object 6 is irradiated with a single pulse of the pump radiation beam 16 so as to produce an acoustic wave in the object 6 propagating away from the surface 8 and subsequently, during the measurement time period, the strength or contrast of a signal generated at the surface is determined. For example, in some embodiments the feature may be a reflective diffraction grating with a particular pitch, which may result in a modulation on the surface 8 that has substantially the same pitch. For such embodiments, the strength or contrast of the signal generated at the surface may be related to an amplitude of the modulation.

Second the surface 8 of the object 6 is irradiated with the temporal intensity distribution to be tested so as to produce an acoustic wave in the object propagating away from the surface 8 and subsequently, during the measurement time period, the strength or contrast of a signal generated at the surface 8 is determined.

Third, the strength or contrast of the signal obtained using the temporal intensity distribution to be tested is compared to that of the signal obtained using the single pulse of the pump radiation beam 16. If the strength or contrast of the signal obtained using the temporal intensity distribution to be tested is greater than that of the signal obtained using the single pulse of the pump radiation beam 16 then the temporal intensity distribution achieved the desired increase in signal to background ratio.

A second method, for determining whether or not a particular temporal intensity distribution maximizes the signal to background ratio in a measurement time period, is now described.

First the surface 8 of the object 6 is irradiated with the temporal intensity distribution to be tested so as to produce an acoustic wave in the object 6 propagating away from the surface 8 and subsequently, during the measurement time period, the strength or contrast of a signal generated at the surface is determined. For example, in some embodiments the feature may be a reflective diffraction grating with a particular pitch, which may result in a modulation on the surface 8 that has substantially the same pitch. For such embodiments, the strength or contrast of the signal generated at the surface may be related to an amplitude of the modulation.

Subsequently, one or more parameters of the temporal intensity distribution to be tested are varied and the and the surface 8 of the object 6 is irradiated with the resultant varied temporal intensity distribution so as to produce an acoustic wave in the object propagating away from the surface 8 and subsequently, during the measurement time period, the strength or contrast of a signal generated at the surface 8 is determined. The one or more parameters of the temporal intensity distribution to be tested may be varied in a plurality of different ways within a parameter space.

Third, the strength or contrast of the signal obtained using the temporal intensity distribution to be tested is compared to that of the or each signal obtained using the varied temporal intensity distribution that results from varying one or more parameters of the temporal intensity distribution to be tested. If the strength or contrast of the signal obtained using the temporal intensity distribution to be tested is greater than that of all signals obtained using the varied temporal intensity distribution that results from varying one or more parameters of the temporal intensity distribution to be tested then the temporal intensity distribution achieved the desired increase in signal to background ratio.

According to some embodiments of the invention there are provided methods for determining a temporal intensity distribution of a pulsed pump radiation beam 16 for irradiating the surface 8 of an object 6 having a feature 4 disposed below the surface 8 with a pulsed pump radiation beam 16 so as to produce an acoustic wave in the object 6 propagating away from the surface 8.

The methods may comprise determining a temporal intensity distribution of the pulsed pump radiation beam 16 such that in the measurement time period a signal to background ratio is greater than a signal to background ratio achieved using a single pulse of the pulsed pump radiation beam 16.

The method for determining a temporal intensity distribution of a pulsed pump radiation beam 16 may be analytical, iterative or a combination of both as now discussed.

The method may comprise determining a plurality of acoustic pathways away from and back to the surface 8 based on the structure of the object 6. For example, for the acoustic pathways 38, 40 shown in FIG. 3 and the acoustic pathways 78, 80, 82 shown in FIG. 8 may be determined. For each determined acoustic pathway, the following may be determined: (a) a time taken for an acoustic pulse to propagate along the acoustic pathway; and (b) an attenuation factor and a phase change for an acoustic pulse propagating along the acoustic pathway. For a pulsed pump radiation beam 16, an acoustic signal at the surface 8 may be determined as a superposition of contributions from each pulse propagating along each acoustic pathway. Finally, one or more parameters of the temporal intensity distribution may be determined such that in a measurement time period the signal to background ratio is enhanced or optimized.

Additionally or alternatively, methods for determining a suitable temporal intensity distribution of a pulsed pump radiation beam 16 may comprise irradiating a surface 8 of the object 6 with a pulsed pump radiation beam 16 so as to produce an acoustic wave in the object 6 propagating away from the surface 8, the pulsed pump radiation beam 16 having a temporal intensity distribution described by a set of one or more parameters. A strength, quality or signal to background ratio of a signal on the surface 8 that is indicative of a feature 4 disposed below the surface 8 may be monitored in parallel. At least one of the one or more parameters of the temporal intensity distribution of the pulsed pump radiation beam 16 may be iteratively varied so as to at least partially enhance or increase the signal that is indicative of a feature 4 below the surface 8 of the object 6 and/or to at least partially suppress or decrease background signals.

For example, the one or more parameters may comprise one or more parameters which characterize the shape of each pulse and/or a time between each pair of pulses.

An initial set of parameters may be chosen and the surface 8 of the object 6 may be irradiated with the pulsed pump radiation beam 16 having a temporal intensity distribution described by the initial set of parameters. During a measurement time period, one or more aspects of the surface 8 of the object 6 may be monitored and compared to an expected or desired signal based on the (potentially known) feature 4 below the surface 8. If a difference between the determined signal and the expected or desired signal based is above a threshold then at least one of the one or more parameters may be changed and the surface 8 of the object 6 may be irradiated with the pulsed pump radiation beam 16 having a temporal intensity distribution described by the changed set of parameters. During a measurement time period, one or more aspects or the surface 8 of the object 6 may be monitored and compared to an expected or desired signal based on the feature 4 below the surface 8.

This process may be repeated until a difference between the determined signal and the expected or desired signal is below the threshold. In some embodiments, the process may be repeated until a local minimum in the difference between the determined signal and the expected or desired signal is found.

With such embodiments, the initial set of parameters may be chosen using an analytical or semi-analytical approach.

As described above, embodiments of the invention involve the tailoring or optimisation of the temporal intensity distribution of a pulsed pump radiation beam 16, especially for a multi-layer object 6. An optimal pulse sequence for the pulsed pump radiation beam 16 will, in general, strongly depend on the composition of the object 6. In general, embodiments of the invention may use any suitable pulse shaping device. Examples of pulse shaping devices that may be used are now discussed.

A general embodiment may use an optical pulse shaper to produce the required pulse sequences. Devices such as spatial light modulators using either liquid crystal cells or deformable mirrors inside a dispersive delay line can produce almost arbitrary pulse shapes and pulse sequences, with controlled timing, amplitude and phase. In these devices, an ultrashort pulse may be dispersed into multiple spectral components, which are given different phase shifts using a programmable liquid crystal mask. The spectral components are then recombined, leading to a shaped pulse in the time domain. Other pulse shaping solutions based on deformable mirrors or electro-optic modulators can also be used. The acoustic transit times may be typically in the range of 10 ps to 1 ns, which can be covered with a high-resolution pulse shaper.

Simpler devices may include arrays of beamsplitters, Michelson and Fabry-Perot interferometers and devices that use interference to create a beat frequency.

Figure 12:
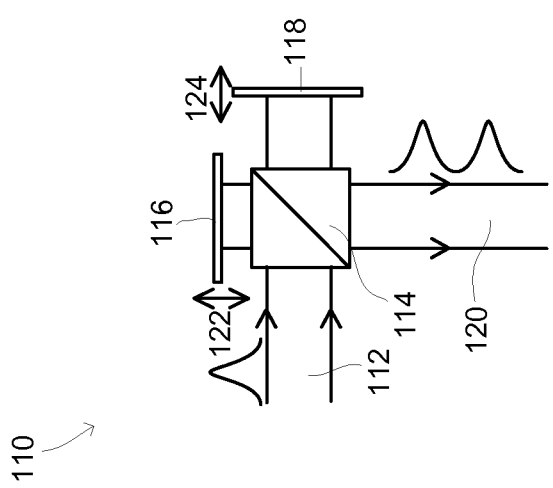
FIG. 12 is a schematic illustration of a Michelson interferometer that can be used for pulse shaping.

FIG. 12 is a schematic illustration of a Michelson interferometer 110 that may be used for pulse shaping. An incoming radiation beam 112 comprising a single Gaussian-like pulse is split into two portions by a beam splitter 114. A first portion is incident on a first mirror 116 and a second portion is incident on a second mirror 118. The portions reflected from the first and second mirrors 116, 118 are recombined by the beam splitter 114 and are output as radiation beam 120. Due to a difference in path lengths to the two mirrors, the output radiation beam comprises two temporally resolved pulses. A temporal separation between the two pulses can be tuned by moving one or more of the two mirrors 116, 118, as indicated by arrows 122, 124. In addition, or alternatively, properties of the two individual pulses such as their amplitudes and widths can be individually tuned by inserting suitable optical elements (for example absorbers or dispersive elements) into one or both of the optical paths followed by only one of the pulses (i.e. where the pulses are spatially separated, for example close to the mirrors 116, 118).

The Michelson interferometer 110 can be extended to generate more pulses by using more beam splitters. For example, mirror 118 may be replaced by another beam splitter and a pair of mirrors arranged to split one of the pulses into two separate pulses before it is recombined with the pulse reflected from mirror 116. Such an arrangement allows for sets of three pulses to be generated with tunable delays. In this way, the device can be extended to generate any number of pulses by using more beam splitters.

Figure 13:
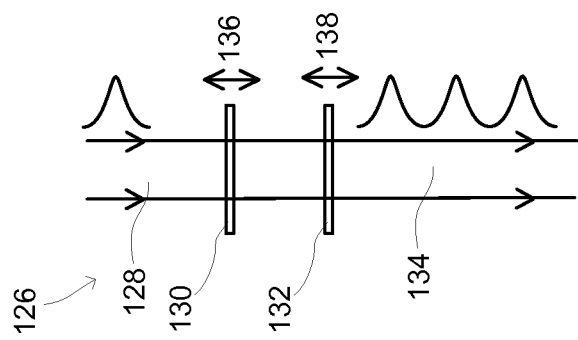
FIG. 13 is a schematic illustration of a Fabry-Perot interferometer that can be used for pulse shaping.

FIG. 13 is a schematic illustration of a Fabry-Perot interferometer 126 that may be used for pulse shaping. An incoming radiation beam 128 comprising a single Gaussian-like pulse is split into multiple portions and subsequently recombined using two partially reflecting mirrors 130, 132. Due to a difference in path length travelled by the multiple portions, an output radiation beam 134 comprises multiple temporally resolved pulses. A temporal separation between the pulses can be tuned by moving one or more of the mirrors 130, 132, as indicated by arrows 136, 138.

Figure 14:
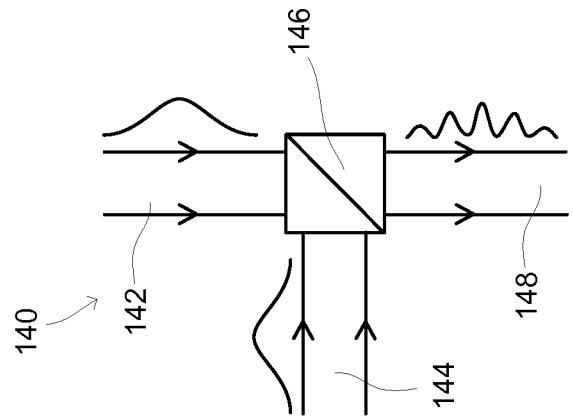
FIG. 14 is a schematic illustration of a device that uses interference to create a beat frequency that can be used for pulse shaping.

FIG. 14 is a schematic illustration of a device 140 that uses interference to create a beat frequency that may be used for pulse shaping. Two incoming radiation beams 142, 144 are combined using a beam splitter 146. Each of the incoming radiation beams 142, 144 comprises a single Gaussian-like pulse. The two incoming radiation beams 142, 144 have different frequencies, a first incoming beam 142 having a first frequency $\omega_1$ and a second incoming beam 144 having a second, different frequency $\omega_2$. The beat frequency $\omega_2-\omega_1$ can be tuned so as to achieve a desired a temporal separation of two peaks in the output radiation beam 148. For example, this may be tuned so as to match a resonance in the object 6, for example a fundamental or a higher order resonance or acoustic mode of an opaque layer within the object 6.

In the above-described apparatus and methods for probing a feature 4 within an object 6 using optically induced acoustic waves, any suitable wavelength of the pulsed pump radiation beam 16 may be used. The spectrum of acoustic wavelengths that is generated may depend on the wavelength of the pulsed pump radiation beam 16, for example if the penetration depth of the radiation varies significantly with wavelength. In turn, the spectrum of acoustic wavelengths generated may have an effect on the optimal temporal shape of the pump. However, such effects are thought to be higher order effects. Therefore it is not expected that the methods will be very sensitive to the choice of wavelength although there may be an optimum wavelength for a given material at the surface 8 (which is typically where the acoustic waves are generated).

In objects 8 with a large number of repeating layers, specific acoustic resonance frequencies can be expected, corresponding to the standing acoustic waves that may be formed in such structures. Those frequencies may be important to consider (either to use or to avoid) when optimizing the signal to background ratio on the surface 8. Acoustic resonances occur for single layers which have a large acoustic impedance mismatch with respect to adjacent layers in the object (for example the layers above and below). For example, acoustic resonance could be expected for a high density layer (for example a metal layer) which is disposed between two low density layers (for example a photoresist or silicon dioxide). Such an arrangement results in an acoustic impedance mismatch on both sides of the high density layer.

The optimum duration for a single pulse of the pulsed pump radiation beam 16 is may be approximately inversely proportional to the highest acoustic frequency that can be used in a specific material. Shorter pulses at similar energy are more likely to lead to damage to the object 8 through multiphoton effects.

A pulsed pump radiation beam 16 comprising a train of equally spaced pulses may give rise to a narrower acoustic spectrum, which can be useful in some embodiments. For example, it may be advantageous to optimize the amount of acoustic energy that is generated within an optimum acoustic spectrum. The optimum acoustic spectrum may comprise, for example, acoustic wavelengths that are short enough to resolve structure of the feature 4 (for example wavelengths that are not longer than twice the depth of a diffraction grating 4). Additionally or alternatively, the optimum acoustic spectrum may comprise, for example, wavelengths that are sufficiently long so as not to be attenuated by an unacceptable amount.

The measurement performed by the measurement system 14 may use any suitable detection geometry, and can be a single-pixel detector or an interferometric detection or camera-based detection system.

Figure 15:
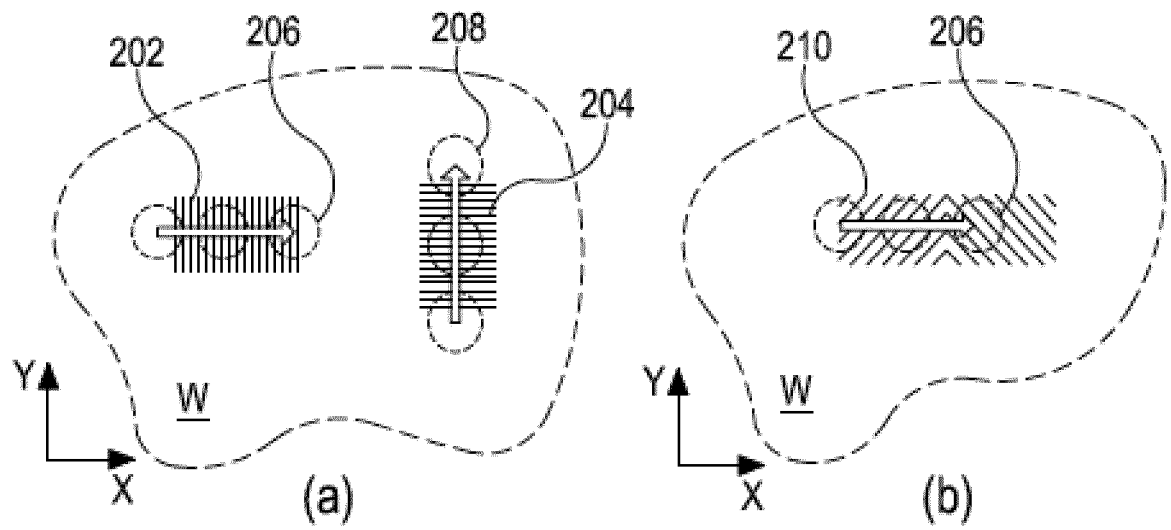
FIG. 15, comprising FIG. 15(*a*) and FIG. 15(*b*), schematically depicts various forms of an alignment mark that may be provided on a substrate in the apparatus of FIG. 1.

The measurement radiation source 12 and measurement system 14 may form part of any known alignment system or alignment sensor as desired. For example in some embodiments the measurement system 14 may be operable to determine the position of an alignment grating by comparing the phases of the positive and negative diffraction orders. For example, the phases of the plus and minus first order diffraction beams (and/or the plus and minus third order, fifth order, etc. diffraction beams) may be compared. This comparison can be performed by interfering the positive and negative diffraction beams with each other, using of a self-referencing interferometer. The total signal may be measured on, for example, a photodiode. Scanning the alignment grating results in a periodic alignment signal, from which the alignment position is retrieved. Examples of such systems are now described with reference to FIGS. 15 to 17.

FIG. 15(a) shows examples of alignment marks 202, 204, that may be provided on substrate W for the measurement of X-position and Y-position, respectively. Each alignment mark in this example comprises a series of bars formed in a product layer or other layer applied to or etched into the substrate. The bars are regularly spaced and act as grating lines so that the alignment mark may be regarded as a diffraction grating with a sufficiently well-known spatial period (pitch). The bars on the X-direction alignment mark 202 are parallel to the Y-axis to provide periodicity in the X direction, while the bars of the Y-direction alignment mark 204 are parallel to the X-axis to provide periodicity in the Y direction. The alignment system AS (shown in FIG. 1) scans each alignment mark optically with a spot 206 (X direction), 208 (Y direction) of radiation, to obtain a periodically-varying signal, such as a sine wave. The phase of this signal is analysed, to measure the position of the alignment mark, and hence of substrate W, relative to the alignment sensor, which in turn is fixed relative to the frame MF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment system AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Alignment marks of different pitches may also be used for this purpose. These techniques are again well known to the person skilled in the art, and will not be detailed herein. The design and operation of such sensors is well known in the art, and each lithographic apparatus may have its own design of sensor. The alignment system AS may be generally of the form described in U.S. Pat. No. 6,961,116 (den Boef et al). FIG. 15(b) shows a modified alignment mark for use with a similar alignment system, which X- and Y-positions can be obtained through a single optical scan with the illumination spot 206 or 208. The alignment mark 210 has bars arranged at 45 degrees to both the X- and Y-axes. This combined X- and Y-measurement may be performed using the techniques described in published patent application US 2009/195768 A (Bijnen et al).

It will be appreciated from the above discussion that the alignment marks 202, 204, 210 may be below the surface of an object, for example covered by one or more process layers, which may be opaque. The apparatus 2 shown in FIG. 2, and the associated methods, can be used to generate a signal on the surface of such an object, using acoustic waves, which is dependent on the underlying alignment mark. It is this signal which the alignment system AS optically scans with a beam spot 206, 208 of radiation. As explained above, the acoustic waves produce a signal that is observable with at least two different optical methods. First, the propagating strain can cause a displacement of the metal lattice. For example, a standing surface acoustic wave may be generated on the surface 8 of an object 6 which mirrors the underlying alignment mark. This surface acoustic wave may act as a diffraction grating for the alignment sensor AS. Additionally or alternatively, the stress related to the acoustic waves induces changes of the dielectric constant via photo-elastic effects, which can result in local differences in the amount of radiation scattered (for example reflected) by the surface 8 of the object 6. These differenced in the reflectivity of the surface 8 may be used by the alignment sensor AS to determine a position.

Figure 16:
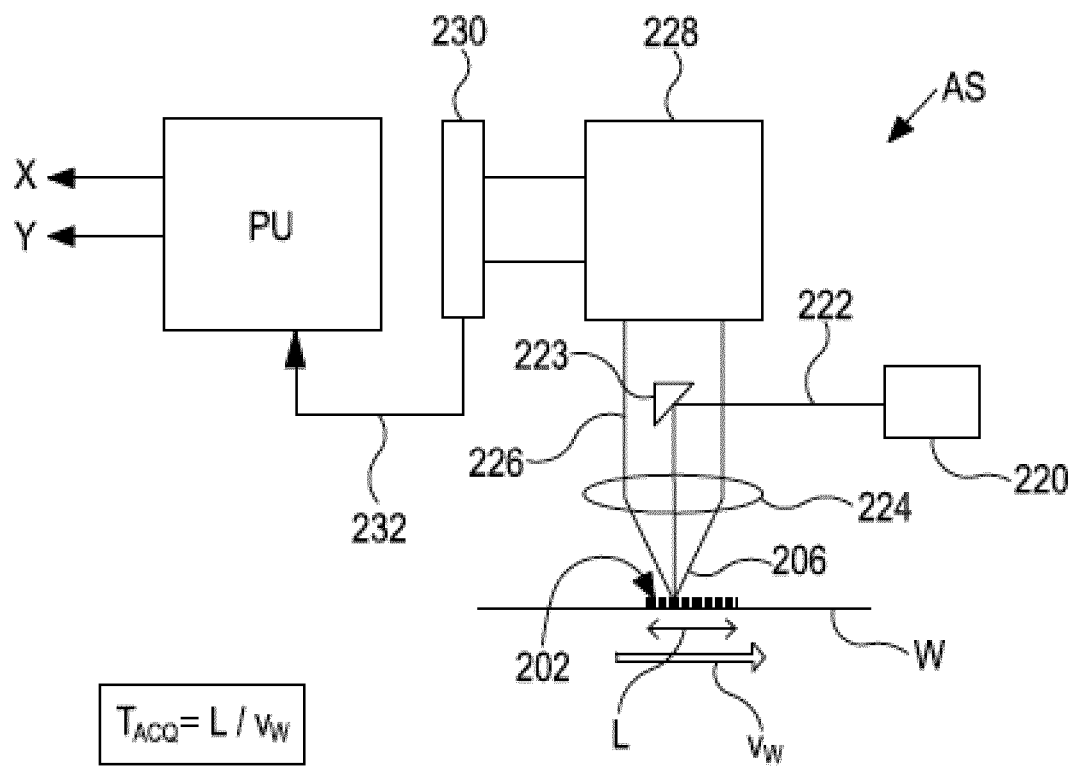
FIG. 16 is a schematic block diagram of a first alignment sensor scanning an alignment mark in the apparatus of FIG. 1.

FIG. 16 is a schematic block diagram of a known alignment sensor AS. Illumination source 220 provides a measurement beam 222 of radiation of one or more wavelengths, which is diverted by a spot mirror 223 through an objective lens 224 onto an alignment mark, such as alignment mark 202, located on substrate W. As indicated schematically in FIG. 15, in the example of the present alignment sensor based on U.S. Pat. No. 6,961,116 mentioned above, the illumination spot 206 by which the alignment mark 202 is illuminated may be slightly smaller in diameter then the width of the alignment mark itself.

Radiation diffracted by the alignment mark 202 is picked up by an objective lens 224 and collimated into an information-carrying beam 226. A self-referencing interferometer 228 is of the type disclosed in U.S. Pat. No. 6,961,116 mentioned above, and processes beam 226 and outputs separate beams (for each wavelength) onto a sensor array 230. The spot mirror 223 serves conveniently as a zero order stop at this point, so that the information carrying beam 226 comprises only higher order diffracted radiation from the alignment mark 202 (this is not essential to the measurement, but improves signal to noise ratios). Intensity signals 232 from individual sensors in a sensor grid 230 are provided to a processing unit PU, which may form part of the processor PR of FIG. 1. By a combination of optical processing in the block 228 and computational processing in the unit PU, values for X- and Y-position on the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the alignment mark within a certain range corresponding to one pitch of the alignment mark. Coarser measurement techniques are used in conjunction with this to identify which period of the sine wave is the one containing the marked position. The same process at coarser and/or finer levels may be repeated at different wavelengths for increased accuracy and/or for robust detection of the alignment mark irrespective of the materials from which the alignment mark is made, and materials on and/or below which it sits. The wavelengths may be multiplexed and demultiplexed optically so as to be processed simultaneously, and/or they may be multiplexed by time division or frequency division. Examples in the present disclosure will exploit measurement at several wavelengths to provide a practical and robust measurement apparatus (alignment sensor) with reduced sensitivity to alignment mark asymmetry.

Referring to the measurement process in more detail, an arrow labelled $V_W$ in FIG. 16 illustrates a scanning velocity with which spot 206 traverses a length L of the alignment mark 202. In this example, the alignment system AS and spot 206 in reality remain stationary, while it is the substrate W that moves with velocity $V_W$. The alignment sensor can thus be mounted rigidly and accurately to the reference frame RF (FIG. 1), while effectively scanning the alignment mark 202 in a direction opposite to the direction of movement of substrate W. The substrate W is controlled in this movement by its mounting on the substrate table WT and the substrate positioning system PW. All movements shown are parallel to the X axis. Similar actions apply for scanning the alignment mark 204 with spot 208 in the Y direction.

As discussed in the published patent application US 2012-0212749 A1, the high productivity requirements required of the lithographic apparatus require the measurement of the alignment marks at numerous positions on the substrate to be performed as quickly as possible, which implies that the scanning velocity $V_W$ is fast, and the time $T_{ACQ}$ available for acquisition of each alignment mark position is correspondingly short. In simplistic terms, the formula $T_{ACQ}=L/V_W$ applies. THE prior application US 2012-0212749 A1 describes a technique to impart an opposite scanning motion of the spot, so as to lengthen the acquisition time. The same scanning spot techniques can be applied in sensors and methods of the type disclosed herein, if desired.

Figure 17:
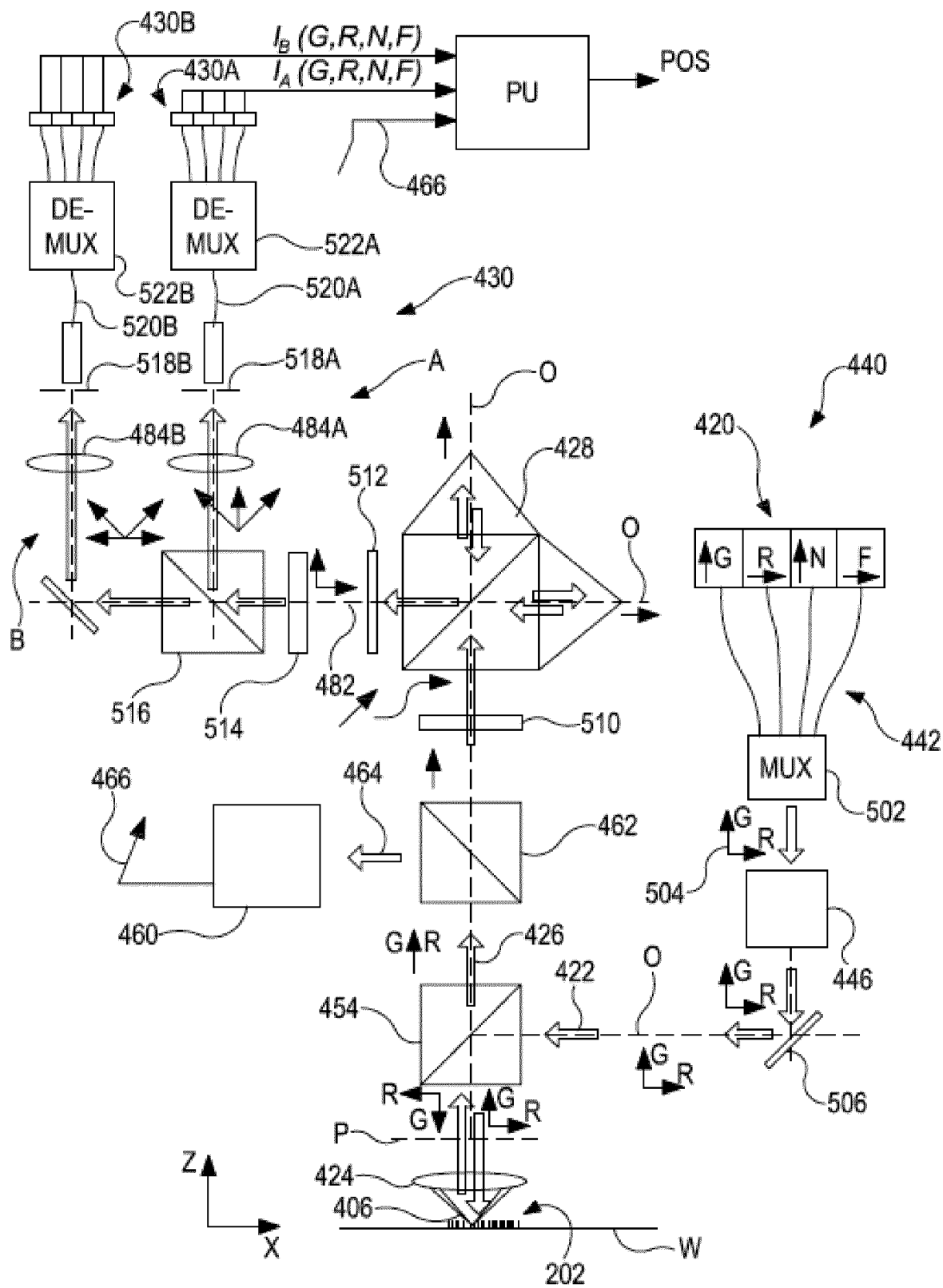
FIG. 17 is a schematic diagram of a second alignment sensor which may be used as the alignment sensor in the apparatus of FIG. 1, including off-axis illumination and an optional asymmetry measuring arrangement (not shown in detail) and further showing features of multiple wavelengths and polarization.

FIG. 17 illustrates an optical system of an alignment sensor that is a modified version of one described in the prior publications U.S. Pat. No. 6,961,116 and US 2009/195768 mentioned above. This introduces the option of off-axis illumination modes which, among other things, allow a reduced pitch of alignment mark for greater accuracy. The optical system may also allow scatterometry type measurements to be performed with the alignment sensor, rather than with a separate scatterometer instrument. In FIG. 17, for simplicity the details of providing off-axis and on-axis modes of illumination are omitted. For the present disclosure it is more interesting to show details of the multiple wavelengths and polarizations.

An optical axis O which has several branches is indicated by a broken line running throughout the optical system shown in FIG. 17. For ease of comparison with the schematic diagram of FIG. 16, some parts of the optical system shown in FIG. 17 are labelled with reference signs similar to those used in FIG. 16, but with prefix "4" instead of "2". Thus, we see a light source 420, an illumination beam 422, an objective lens 424, an information carrying beam 426, a self-referencing interferometer 428 and a detector arrangement 430. Signals from the detector arrangement are processed by processing unit PU, which is modified so as to implement the novel features described below and to output an (improved) position measurement POS for each alignment mark.

Additional components illustrated in this more detailed schematic diagram are as follows. In an illumination subsystem 440, radiation from source 420 is delivered via optical fibres 442 to an illumination profiling optics 446. This delivers input beam 422 via beam splitter 454 to objective lens 424 having a pupil plane P. Objective lens 424 forms a spot 406 on alignment mark 202/204/210 on the wafer W. Information-carrying beam 426, diffracted by the alignment mark, passes through beam splitter 454 to interferometer 428. Interferometer 428 splits the information carrying beam into two parts with orthogonal polarization, rotates these parts about the optical axis by 180° relative to one another, and combines them into an outgoing beam 482. The outgoing beam 482 enters the detector arrangement 430 as will be described in more detail below.

Included in the present example is an asymmetry measuring arrangement 460. Arrangement 460 receives a part 464 of the information carrying beam 426 through a second beam splitter 462 positioned in advance of the interferometer. Another patent application, US 20125227061, describes techniques for the measurement of asymmetry using position information obtained through the detector 430. It will be appreciated that the asymmetry measuring arrangement 460 is optional and may therefore be omitted in other embodiments.

Illumination profiling optics 446 can take various forms, some of which are disclosed in more detail in prior patent application US 2015109624. In the examples disclosed therein, alignment sensors (more generally, position measuring apparatuses) are shown which allow the use of reduced grating pitches without the need for spatial resolution on the detector side. By use of illumination modes, these apparatuses are able to measure the positions of alignment marks with a wide range of different pitches, for example from less than 1 µm to pitches of 20 micron, without changing the current detector design. A particular feature common to the examples described in the prior application US 2015109624, is the option to use off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the alignment mark from substantially λ/NA to substantially λ/2NA, where λ is the wavelength of radiation used, and NA is the numerical aperture of an objective lens of the instrument (e.g. the alignment sensor or more generally the position measuring apparatus). The examples described in the prior application US 2015109624, also use a particular distribution of spot mirrors in a beam splitter of the apparatus, which can both provide the desired illumination and act as a field stop for zero order diffracted radiation. A 'universal' illumination profile can be designed that allows for aligning on any of the X, Y and XY alignment marks without changing the illumination mode, although this inevitably brings some compromise in performance and/or some complication in the apparatus. Alternatively, dedicated modes can be designed and made to be selectable for use with the different alignment mark types. Different polarizations of illumination can be selected also.

The apparatus as a whole need not be limited to providing these particular off-axis illumination profiles. It may have other modes of use, both known or yet to be developed, which favour the use of different profiles. For example, the apparatus may provide for selection of on- and off-axis illumination modes for the different alignment mark types shown in FIGS. 15(a) and (b). While off-axis illumination is of interest for use with finer gratings, an on-axis illumination profile may be useful for compatibility with existing alignment marks and measurement methods. Referring firstly to the example of an on-axis mode, as used in the known sensor of FIG. 16, illumination normal to the substrate is provided by an on-axis illumination profile having a central bright spot within an otherwise dark pupil. This profile is an optional setting in the illumination beam 422 of the apparatus. In this example, it is desired for the zero order beam which returns along the optical axis to be blocked before entry into the interferometer 428, but also for it to be transferred to the asymmetry measuring arrangement 460 (when provided). To block the zero order before the interferometer 428 is not essential, but improves the signal to noise ratio of the position signal. Accordingly, in this embodiment, a spot mirror may be included in the second beam splitter 462. The first splitter 454 is not silvered, and one accepts that only 50% or so of the intensity of the central spot may is transferred to the alignment mark. In an alternative embodiment, where the arrangement 460 is omitted, this profile may be produced directly by illumination profiler 446 and transmitted at full intensity to objective 424 by a spot mirror within the first beam splitter 454. A variety of alternatives can be envisaged to obtain a desired profile.

Off-axis illumination profiles can be produced in a number of ways to form a practical instrument, bearing in mind that the opposed segments should be coherent for the interferometer 428 to produce the desired signal. Particularly when a broadband source is involved, the coherence length/time of the source radiation will be very short. Even with a monochromatic laser source, U.S. Pat. No. 6,961,116 teaches that a short coherence time is preferred, for example to eliminate interference from undesired multiple reflections. Consequently, optical path lengths from the source to each segment should be very closely matched. An aperture corresponding directly to the desired profile could be placed in a widened parallel beam, but that would result in a relatively large light loss. To circumvent the loss of light, various alternative solutions are provided in the prior application US 2015109624, mentioned above.

The illumination emerging from the illumination source 442 may be monochromatic but is typically broadband in nature, for example white light, or polychromatic. It will be appreciated that the illumination source 442 is a source operable to emit electromagnetic radiation. This radiation may comprise visible light and/or electromagnetic radiation outside of the visible spectrum, for example infrared radiation. It will be appreciated that in the following the term "radiation" is synonymous with the term "light" and may be used interchangeably. Similarly, a wavelength (or range of wavelengths) of such radiation may be referred to as the "colour" of the radiation whether the radiation is from the visible spectrum or not. A diversity of wavelengths in the beam increases the robustness of the measurement, as is known. One known sensor uses for example a set of four wavelengths, each of the four wavelengths being in the range 500 nm to 900 nm. These four wavelengths may be referred to by the name of their colours, which may be: green (comprising green light), red (comprising red light), near infrared (comprising radiation in the near infrared) and far infrared (comprising radiation in the far infrared). In a sensor implementing the present invention, the same four wavelengths could be used, or a different four, or more or fewer than four wavelengths might be used.

Referring to FIG. 17 again, aspects of the apparatus concerned with measurement using multiple wavelengths of radiation, and concerned with the management of polarization effects, will now be explained. In the illumination subsystem 440, the source 420 comprises four individual light sources that are provided to produce radiation of four wavelengths named green (labelled G), red (R), near infrared (N) and far infrared (F). For convenience in the following discussion, the radiation at these four different wavelengths will be called four colours of light, it being immaterial for present purposes whether they are in the visible or non-visible parts of the electromagnetic spectrum. The light sources are linearly polarized, with the G and N radiation being oriented the same as one another, and the R and F radiation being polarized orthogonally to the polarization of the G and N radiation.

The four colours are transported by polarization maintaining fibres to a multiplexer 502, where they are combined into a single four-colour beam. The multiplexer maintains linear polarization, as indicated by arrows 504. The arrows 504 and similar arrows throughout the diagram are labelled G and R to indicate polarization of the green and red components. The N and F components are oriented the same as the G and R components, respectively.

This combined beam goes via suitable delivery optics 506 into beam splitter 454. As already described, it then reflects from a partially- or fully reflecting surface (e.g. a 0.5 mm diameter spot mirror), which is inside the beam splitter. The objective lens 424 focuses the beam to a narrow beam which is reflected and diffracted by the grating formed by alignment mark 202 on the wafer W. Light is collected by objective lens 424, with for example a numerical aperture NA=0.6. This NA value allows at least ten orders of diffraction to be collected from a grating with 16 µm pitch, for each of the colours.

The reflected and diffracted light forming information carrying beam 426 is then transported to the self-referencing interferometer 428. In this example, as already described, the beam is split by beam splitter 462 to supply a portion 464 of the information carrying beam to the asymmetry measuring arrangement 460, when provided. Signals 466 conveying asymmetry measurement information are passed from arrangement 460 to the processing unit PU. Just before the interferometer, polarization is rotated by 45° by a half wave plate 510. From this point on, polarization arrows are shown for only one colour, for clarity. The interferometer, as already described above and in the U.S. Pat. No. 6,961,116, consists of a polarizing beam splitter, where half of each colour is transmitted, and half of each colour reflected. Each half is then reflected three times inside the interferometer, rotating the radiation field by +90° and −90°, giving a relative rotation of 180°. The two fields are then superimposed on top of each other and allowed to interfere. A phase compensator 512 is present to compensate for path differences of the −90° and 90° image. The polarization is then rotated 45° by another half wave plate 514 (having its major axis set at 22.5° to the X or Y axis). The half wave plates 510, 514 are wavelength insensitive, so that polarizations of all four wavelengths are rotated by 45°.

A further beam splitter 516 splits the optical signal into two paths designated A and B. One path contains the sum of the two rotated fields, and the other contains the difference. Depending on the initial polarization direction, the sum ends up in Path A or Path B. So in this example the sum signals for Green and NIR signals end up in one path, Red and FIR in the other. For each colour, the corresponding difference signal ends up in the other path. It will be appreciated that a radiation source is a source operable to emit radiation, for example electromagnetic radiation. The radiation may comprise visible light. Alternatively, the radiation may comprise electromagnetic radiation outside of the visible spectrum, for example infrared radiation. It will be appreciated that in the above description the term "radiation" is synonymous with the term "light". Any reference to light may therefore encompass electromagnetic radiation outside of the visible spectrum.

Note that this arrangement chooses to use one polarization for illumination in each colour. Measurements with two polarizations per colour could be made, by changing the polarization between readings (or by time division multiplexing within a reading). However, to maintain high throughput while benefiting from some diversity in colour and polarization, a set of different colours, each colour being linearly polarized and with one subset of the colours having one polarization direction and another subset of the colours having a different polarization direction, represents a good compromise between diversity and measurement throughput. To increase diversity without impacting throughput, one can envisage an implementation similar to the four-colour scheme presented here, but using more colours, for example eight or sixteen, with mixed polarizations.

The light for each path A and B is collected by a respective collector lens assembly 484A and 484B. It then goes through an aperture 518A or 518B that eliminates most of the light from outside the spot on the substrate. Two multimode fibres 520A and 520B transport the collected light of each path to respective demultiplexers 522A and 522B. The demultiplexers 522A, 522B split each path in the original four colours, so that a total of eight optical signals are delivered to detectors 430A and 430B within detector arrangement 430. In one practical embodiment, fibres are arranged between the demultiplexers and eight detector elements on a detector circuit board. The detectors in this example provide no spatial resolution, but deliver time-varying intensity signals $I_A$ and $I_B$ for each colour, as the apparatus scans the alignment mark 202 on substrate W. The signals are actually position-dependent signals, but received as time-varying signals (waveforms) synchronized with the physical scanning movement between the apparatus and the alignment mark (recall FIG. 16).

Processing unit PU receives the intensity waveforms from the eight detectors and processes these as in the known apparatus to provide a position measurement POS. Because there are eight signals to choose from, based on different wavelengths and incident polarizations, the apparatus can obtain useable measurements in a wide variety of situations. In this regard it should be remembered that the alignment mark 202 may be buried under a number of layers of different materials and structures. Some wavelengths will penetrate different materials and structures better than others. The processing unit PU conventionally processes the waveforms and provides a position measurement based on the one which is providing the strongest position signal. The remaining waveforms may be disregarded. In a simple implementation, the 'recipe' for each measurement task may specify which signal to use, based on advance knowledge of the target structure, and experimental investigations. In more advanced systems an automatic selection can be made, using "Color Dynamic" or "Smooth Color Dynamic" algorithms to identify the best signals without prior knowledge. This is described by Jeroen Huijbregtse et al in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003).

Each lens 484A, 484B focuses the entire field onto each element of each detector 430A, 430B, which is an arrangement similar to the known alignment sensor of FIG. 16. The detectors in this example and in the known alignment sensor are effectively single photodiodes and do not provide any spatial information except by the scanning motion described already. A detector having spatial resolution in a conjugate pupil plane can be added, if desired. This may, for example, allow angle-resolved scatterometry methods to be performed using the alignment sensor hardware.

The alignment mark may need to be scanned more than once if it is desired for example to measure position using two different polarizations. Also it may be required to switch the illumination mode midway through scanning the XY alignment mark. In other embodiments, however, multiplexing of optical signals may be used so that two measurements can be made simultaneously. Similarly, multiplexing can be applied so that different portions of the XY alignment mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at each detector 430A, 430B will be a mixture of two signals, but they can be separated electronically using filters tuned to the respective frequencies of the source radiation. Time division multiplexing could also be used, but this would require accurate synchronization between source and detector. The modulation at each frequency can be a simple sine or square wave, for example.

If it is desired to illuminate an alignment mark with circular polarization, whether for position sensing or some other form of metrology, a quarter wave plate (not shown) can be inserted between beam splitter 454 and objective 424. This has the effect of turning a linear polarization into a circular one (and changing it back again after diffraction by the alignment mark). The spot positions are chosen as before according to the alignment mark direction. The direction of circular polarization (clockwise/counter clockwise) can be changed by selecting a different linear polarization in the illumination source 420, optical fibres 442 or illumination profiling optics 446.

Also described in the paper by Huijbregtse et al is the use of multiple gratings in a composite target. Each grating has a different profile, enhancing for example higher diffraction orders (3rd, 5th, 7th). Position measurements can be derived from different ones of these gratings, as well as from different colour signals on an individual grating. In the present disclosure, it is assumed that there is a single grating with a simple bar pattern, but having segmented features. The skilled reader can readily expand the disclosure to envisage embodiments having multiple gratings with different patterns.

It will be appreciated that a radiation source is a source operable to emit radiation, for example electromagnetic radiation. The radiation may comprise visible light. Therefore, it will be appreciated that the term "radiation" may be synonymous with the term "light".

Although specific reference has been made to the alignment method being used with position measurement apparatus, it is to be understood that the method of measuring asymmetries described herein may also be used to measure overlay between multiple layers of a substrate. For example, the method may be applied when measuring an overlay between coarse and fine features of different layers of a substrate.

Although specific reference may be made in this text to embodiments of the invention in the context of a lithographic apparatus, embodiments of the invention may be used in other apparatus. A radiation source according to embodiments of the present invention may, for example, be used for medical applications, for example as part of a metrology system within a medical device. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the lithographic apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including infrared radiation (e.g. having a wavelength between 800 nm-2.5 µm), visible ration (e.g. having a wavelength between 380 nm-800 nm), ultraviolet (UV) radiation (e.g. having a wavelength of 365, 248, 193, 157 or 126 nm) and extreme ultra-violet (EUV) radiation (e.g. having a wavelength in the range of 5-20 nm). In the context of exposure of a substrate, for example using the lithographic apparatus shown in FIG. 1A, the terms "radiation" and "beam" may include: ultra-violet (UV) radiation (e.g. having a wavelength of 365, 248, 193, 157 or 126 nm) and extreme ultra-violet (EUV) radiation (e.g. having a wavelength in the range of 5-20 nm) and particle beams, such as ion beams or electron beams. In the context of the supercontinuum radiation beam $B_{out}$ output by the supercontinuum radiation source 600 shown in FIG. 5, the terms "radiation" and "beam" may include: infrared radiation (e.g. having a wavelength between 800 nm-2.5 µm) and visible ration (e.g. having a wavelength between 380 nm-800 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method for determining a characteristic of a feature in an object, the feature being disposed below a surface of the object, the method comprising:
   irradiating the surface of the object with a pulsed pump radiation beam so as to produce an acoustic wave in the object;
   irradiating the surface of the object with a measurement radiation beam;
   receiving at least a portion of the measurement radiation beam scattered from the surface; and
   determining a characteristic of the feature in the object from at least a portion of the measurement radiation beam scattered from the surface within a measurement time period;
   wherein a temporal intensity distribution of the pulsed pump radiation beam is selected such that in the measurement time period a signal to background ratio is greater than a signal to background ratio achieved using a single pulse of the pulsed pump radiation beam, the signal to background ratio being a ratio of: (a) signals generated at the surface by reflections of acoustic waves from the feature to (b) background signals generated at the surface by reflections of acoustic waves which have not reflected from the feature.

2. The method of claim 1, wherein the measurement time period corresponds to a time period during which a portion of an acoustic wave generated by an initial pulse of the pulsed pump radiation beam, which is reflected from the feature and not from any other interfaces within the object, arrives at the surface.

3. The method of claim 1, wherein the temporal intensity distribution of the pulsed pump radiation beam is such that in the measurement time period there is at least partial constructive interference between: (i) a reflected portion of the acoustic wave generated by a first pulse, the reflected portion of the acoustic wave generated by the first pulse having reflected from the feature; and (ii) a reflected portion of the acoustic wave generated by a second pulse, the reflected portion of the acoustic wave generated by the second pulse having also been reflected from the feature.

4. The method of claim 1, wherein the temporal intensity distribution of the pulsed pump radiation beam is such that in the measurement time period there is at least partial destructive interference between: (i) a reflected portion of the acoustic wave generated by a first pulse which is not incident on the feature; and (ii) a reflected portion of the acoustic wave generated by a second pulse which is not incident on the feature.

5. The method of claim 1, wherein the temporal intensity distribution of the pulsed pump radiation beam is selected such that the signal to background ratio in the measurement time period is generally maximized.

6. An apparatus for determining a characteristic of a feature in an object, the feature being disposed below a surface of the object, the apparatus comprising:
a pump radiation source operable to irradiate the surface of the object with a pulsed pump radiation beam so as to produce an acoustic wave in the object;
a measurement radiation source operable to irradiate the surface of the object with a measurement radiation beam; and
a measurement system operable to receive at least a portion of the measurement radiation beam scattered from the surface and further operable to determine a characteristic of the feature in the object from at least a portion of the measurement radiation beam scattered from the surface within a measurement time period;
wherein the pump radiation source is arranged such that a temporal intensity distribution of the pulsed pump radiation beam is such that in the measurement time period a signal to background ratio is greater than a signal to background ratio achieved using a single pulse of the pulsed pump radiation beam, the signal to background ratio being a ratio of: (a) signals generated at the surface by reflections of acoustic waves from the feature to (b) background signals generated at the surface by reflections of acoustic waves which have not reflected from the feature.

7. A method for determining a temporal intensity distribution of a pulsed pump radiation beam for irradiating a surface of an object having a feature disposed below the surface with a pulsed pump radiation beam so as to produce an acoustic wave in the object, the method comprising:
determining a temporal intensity distribution of the pulsed pump radiation beam such that in a measurement time period a signal to background ratio is greater than a signal to background ratio achieved using a single pulse of the pulsed pump radiation beam,
wherein the signal to background ratio is a ratio of: (a) signals generated at the surface by reflections of acoustic waves from the feature to (b) background signals generated at the surface by reflections of acoustic waves which have not reflected from the feature.

8. The method of claim 7, wherein the measurement time period corresponds to a time period during which a portion of an acoustic wave generated by an initial pulse of the pulsed pump radiation beam, which is reflected from the feature and not from any other interfaces within the object, arrives at the surface.

9. The method of claim 7, wherein the temporal intensity distribution of the pulsed pump radiation beam is determined such that in the measurement time period there is at least partial constructive interference between: (i) a reflected portion of the acoustic wave generated by a first pulse, the reflected portion of the acoustic wave generated by the first pulse having reflected from the feature; and (ii) a reflected portion of the acoustic wave generated by a second pulse, the reflected portion of the acoustic wave generated by the second pulse having also been reflected from the feature.

10. The method of claim 7, wherein the temporal intensity distribution of the pulsed pump radiation beam is determined such that in the measurement time period there is at least partial destructive interference between: (i) a reflected portion of the acoustic wave generated by a first pulse which is not incident on the feature; and (ii) a reflected portion of the acoustic wave generated by a second pulse which is not incident on the feature.

11. The method of claim 7 comprising:
determining a plurality of acoustic pathways away from and back to the surface based on the structure of the object;
for each determined acoustic pathway, determining a time taken for an acoustic pulse to propagate along the acoustic pathway, and an attenuation factor and a phase change for an acoustic pulse propagating along the acoustic pathway;
for a pulsed pump radiation beam, determining an acoustic signal at the surface as a superposition of contributions from each pulse propagating along each pathway and determining one or more parameters of the temporal intensity distribution, such that in a measurement time period: the ratio of signals generated at the surface by reflections of acoustic waves from the feature to background signals generated at the surface by reflections of acoustic waves which have not reflected from the feature is enhanced.

12. The method of claim 11, wherein the one or more parameters of the temporal intensity distribution are determined such that:
there is at least partial constructive interference between one or more contributions from pathways that reflect from the feature; and/or
there is at least partial destructive interference between one or more contributions from pathways that are not incident on the feature.

13. The method of claim 7, comprising:
irradiating a surface of the object with a pulsed pump radiation beam so as to produce an acoustic wave in the object, the pulsed pump radiation beam having a temporal intensity distribution described by a set of one or more parameters; and
iteratively varying at least one of the one or more parameters of a temporal intensity distribution of the pulsed pump radiation beam so as to at least partially increase a signal that is indicative of a feature below the surface of the object and/or to at least partially decrease a background signal.

14. The method of claim 7, comprising:
irradiating a surface of the object with a pump radiation beam so as to produce an acoustic wave in the object;
measuring a signal generated at the surface of the object; and
using the determined signal to determine the temporal intensity distribution of the pulsed pump radiation beam.

15. A method for determining a temporal intensity distribution of a pulsed pump radiation beam for irradiating a surface of an object having a feature disposed below the surface with a pulsed pump radiation beam so as to produce an acoustic wave in the object, the method comprising:
determining a temporal intensity distribution of the pulsed pump radiation beam such that in a measurement time period a signal to background ratio is substantially maximized,
wherein the signal to background ratio is a ratio of: (a) signals generated at the surface by reflections of acoustic waves from the feature to (b) background signals generated at the surface by reflections of acoustic waves which have not reflected from the feature.

16. A method for determining a characteristic of a feature in an object, the feature being disposed below a surface of the object, the method comprising:
- irradiating the surface of the object with a pulsed pump radiation beam so as to produce an acoustic wave in the object;
- irradiating the surface of the object with a measurement radiation beam;
- receiving at least a portion of the measurement radiation beam scattered from the surface; and
- determining a characteristic of the feature in the object from at least a portion of the measurement radiation beam scattered from the surface within a measurement time period;
- wherein a temporal intensity distribution of the pulsed pump radiation beam is such that in the measurement time period there is at least partial constructive interference between: (i) a reflected portion of the acoustic wave generated by a first pulse, the reflected portion of the acoustic wave generated by the first pulse having reflected from the feature; and (ii) a reflected portion of the acoustic wave generated by a second pulse, the reflected portion of the acoustic wave generated by the second pulse having also been reflected from the feature.

17. A method for determining a characteristic of a feature in an object, the feature being disposed below a surface of the object, the method comprising:
- irradiating the surface of the object with a pulsed pump radiation beam so as to produce an acoustic wave in the object;
- irradiating the surface of the object with a measurement radiation beam;
- receiving at least a portion of the measurement radiation beam scattered from the surface; and
- determining a characteristic of the feature in the object from at least a portion of the measurement radiation beam scattered from the surface within a measurement time period;
- wherein a temporal intensity distribution of the pulsed pump radiation beam is such that in the measurement time period there is at least partial destructive interference between: (i) a reflected portion of the acoustic wave generated by a first pulse which is not incident on the feature; and (ii) a reflected portion of the acoustic wave generated by a second pulse which is not incident on the feature.

18. An apparatus for determining a characteristic of a feature in an object, the feature being disposed below a surface of the object, the apparatus comprising:
- a pump radiation source operable to irradiate the surface of the object with a pulsed pump radiation beam so as to produce an acoustic wave in the object;
- a measurement radiation source operable to irradiate the surface of the object with a measurement radiation beam; and
- a measurement system operable to receive at least a portion of the measurement radiation beam scattered from the surface and further operable to determine a characteristic of the feature in the object from at least a portion of the measurement radiation beam scattered from the surface within a measurement time period;
- wherein the pump radiation source is arranged such that a temporal intensity distribution of the pulsed pump radiation beam is such that in the measurement time period there is at least partial constructive interference between: (i) a reflected portion of the acoustic wave generated by a first pulse, the reflected portion of the acoustic wave generated by the first pulse having been reflected from the feature; and (ii) a reflected portion of the acoustic wave generated by a second pulse, the reflected portion of the acoustic wave generated by the second pulse having also been reflected from the feature.

19. An apparatus for determining a characteristic of a feature in an object, the feature being disposed below a surface of the object, the apparatus comprising:
- a pump radiation source operable to irradiate the surface of the object with a pulsed pump radiation beam so as to produce an acoustic wave in the object;
- a measurement radiation source operable to irradiate the surface of the object with a measurement radiation beam; and
- a measurement system operable to receive at least a portion of the measurement radiation beam scattered from the surface and further operable to determine a characteristic of the feature in the object from at least a portion of the measurement radiation beam scattered from the surface within a measurement time period;
- wherein the pump radiation source is arranged such that a temporal intensity distribution of the pulsed pump radiation beam is such that in the measurement time period there is at least partial destructive interference between: (i) a reflected portion of the acoustic wave generated by a first pulse which is not incident on the feature; and (ii) a reflected portion of the acoustic wave generated by a second pulse which is not incident on the feature.

20. A method for determining a characteristic of a feature in an object, the feature being disposed below a surface of the object, the method comprising:
- irradiating the surface of the object with a pump radiation beam so as to produce an acoustic wave in the object;
- irradiating the surface of the object with a measurement radiation beam;
- receiving at least a portion of the measurement radiation beam scattered from the surface; and
- determining a characteristic of the feature in the object from at least a portion of the measurement radiation beam scattered from the surface within a measurement time period;
- wherein a temporal intensity distribution of the pump radiation beam is selected such that in the measurement time period a signal to background ratio is substantially maximized, the signal to background ratio being a ratio of: (a) signals generated at the surface by reflections of acoustic waves from the feature to (b) background signals generated at the surface by reflections of acoustic waves which have not reflected from the feature.

21. An apparatus for determining a characteristic of a feature in an object, the feature being disposed below a surface of the object, the apparatus comprising:
- a pump radiation source operable to irradiate the surface of the object with a pulsed pump radiation beam so as to produce an acoustic wave in the object;
- a measurement radiation source operable to irradiate the surface of the object with a measurement radiation beam; and
- a measurement system operable to receive at least a portion of the measurement radiation beam scattered from the surface and further operable to determine a characteristic of the feature in the object from at least a portion of the measurement radiation beam scattered from the surface within a measurement time period;

wherein the pump radiation source is arranged such that a temporal intensity distribution of the pulsed pump radiation beam is such that in the measurement time period signal to background ratio is substantially maximized, the signal to background ratio being a ratio of: (a) signals generated at the surface by reflections of acoustic waves from the feature to (b) background signals generated at the surface by reflections of acoustic waves which have not reflected from the feature.

* * * * *